United States Patent
Ohkubo et al.

(10) Patent No.: US 6,313,484 B1
(45) Date of Patent: Nov. 6, 2001

(54) CIRCUIT-INTEGRATED LIGHT-RECEIVING DEVICE

(75) Inventors: Isamu Ohkubo; Masaru Kubo, both of Nara-ken; Naoki Fukunaga, Kyoto; Takahiro Takimoto, Nara-ken; Mutsumi Oka, Kyoto; Toshimitsu Kasamatsu, Nara-ken, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/472,886

(22) Filed: Dec. 28, 1999

(30) Foreign Application Priority Data

Dec. 28, 1998 (JP) .................................................. 10-374824
Nov. 15, 1999 (JP) .................................................. 11-324750

(51) Int. Cl.$^7$ .................................................. H01L 27/15
(52) U.S. Cl. ........................... 257/79; 257/432; 257/443; 257/446; 257/343
(58) Field of Search ............................ 257/79, 343, 432, 257/443, 446

(56) References Cited

U.S. PATENT DOCUMENTS

| | | | |
|---|---|---|---|
| 4,184,170 | * 1/1980 | Burnham et al. | 357/17 |
| 4,831,430 | 5/1989 | Umeji . | |
| 5,283,460 | * 2/1994 | Mita | 257/432 |
| 5,410,175 | 4/1995 | Kyomasu et al. . | |
| 5,485,027 | * 1/1996 | Williams et al. | 257/343 |
| 5,602,415 | * 2/1997 | Kubo et al. | 257/443 |

FOREIGN PATENT DOCUMENTS

| | | |
|---|---|---|
| 0501316A2 | 9/1992 | (EP) . |
| 0576009A1 | 12/1993 | (EP) . |
| 0766323A2 | 4/1997 | (EP) . |
| 0855743A2 | 7/1998 | (EP) . |
| 61154163A | 7/1986 | (JP) . |
| 63122164 | 5/1988 | (JP) . |
| 61154063 | 5/1989 | (JP) . |
| 1205564A | 8/1989 | (JP) . |
| 4271172 | 9/1992 | (JP) . |
| 4271172A | 9/1992 | (JP) . |
| 832100A | 2/1996 | (JP) . |

* cited by examiner

Primary Examiner—Fetsum Abraham
Assistant Examiner—Leonardo Andujor

(57) ABSTRACT

A circuit-integrated light-receiving device of the present invention includes: a semiconductor substrate of a first conductivity type; a first semiconductor crystal growth layer of the first conductivity type provided on a surface of the semiconductor substrate, wherein the first semiconductor crystal growth layer includes a first portion whose impurity concentration gradually decreases in a direction away from the surface of the semiconductor substrate and a second portion located in a first region above the first portion whose impurity concentration distribution is uniform in a depth direction; a buried diffusion layer of the first conductivity type located in a second region which is above the first portion of the first semiconductor crystal growth layer and does not overlap the first region; a second semiconductor crystal growth layer of a second conductivity type which is provided across a surface of the first semiconductor crystal growth layer and a surface of the buried diffusion layer; and a separation diffusion region having the first conductivity type for dividing the second semiconductor crystal growth layer into a light-receiving device section and a signal processing circuit section. The first region is located in the light-receiving device section. In the signal processing circuit section, the buried diffusion layer is in contact with the first portion of the first semiconductor crystal growth layer.

28 Claims, 28 Drawing Sheets

FIG.23

| Cross-sectional structure of photodiode | Cut-off frequency of photodiode |
|---|---|
| (a) Anode electrode, Cathode electrode | 104MHz |
| (b) Anode electrode, Cathode electrode | 118MHz |
| (c) Anode electrode, Cathode electrode | 120MHz |

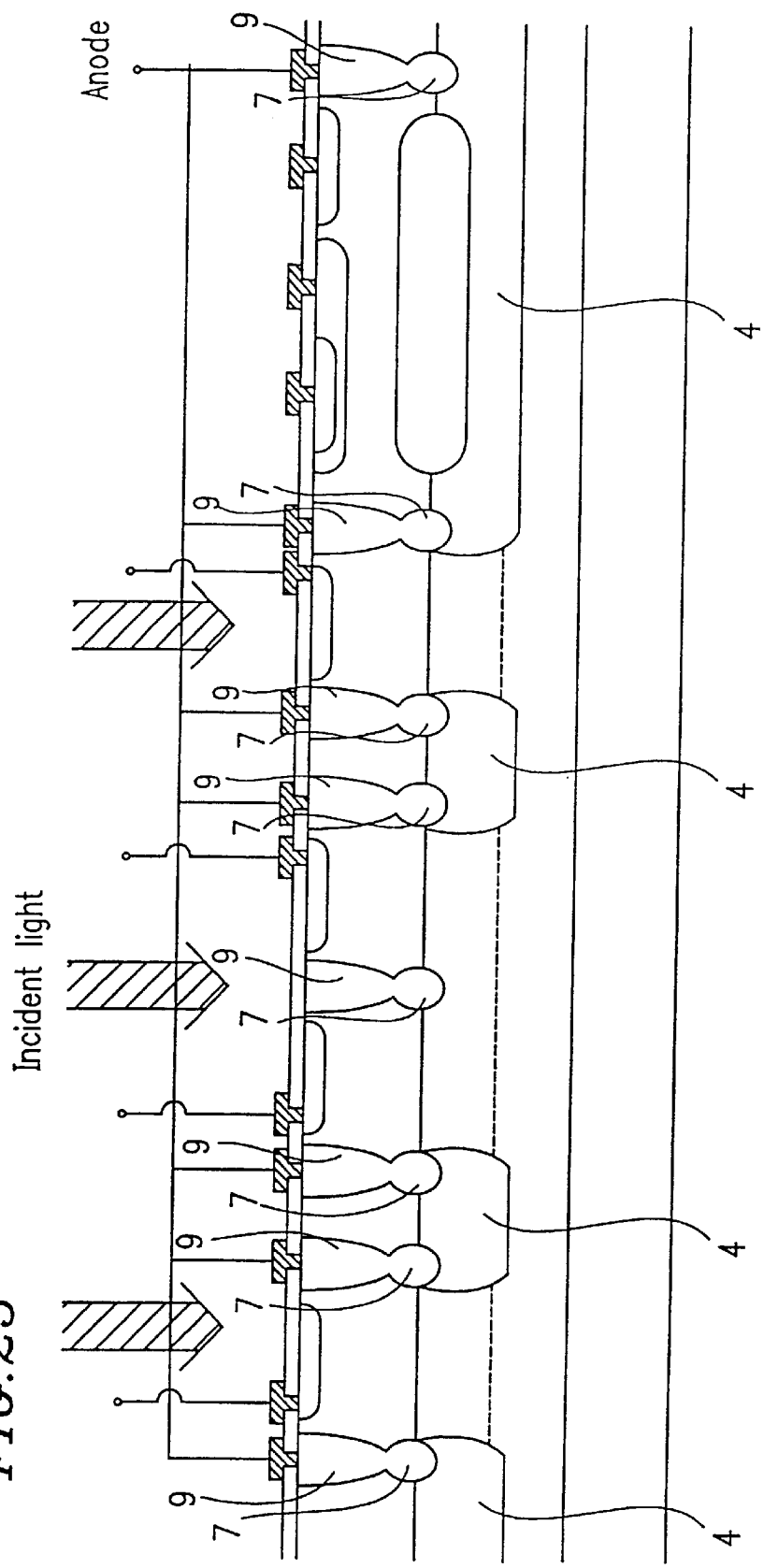

CIRCUIT-INTEGRATED LIGHT-RECEIVING DEVICE

BACKGROUND OF THE INVENTION

1. Field of the Invention

The present invention relates to a light-receiving device including a built-in circuit for processing a photoelectrically converted signal (hereinafter, referred to as a "circuit-integrated light-receiving device"). More particularly, the present invention relates to a circuit-integrated light-receiving device having a capability of improving the response speed of a photodiode which generates the photoelectrically converted signal based on incident light.

2. Description of the Related Art

In recent years, an optical disk apparatus is required to process a large amount of data such as video data at a high speed. For example, an optical disk apparatus for use with a DVD (a DVD-ROM apparatus) has been rapidly improved in terms of the data read speed (e.g., from a normal-speed drive to a double-speed drive). In the future, an optical disk apparatus with an even faster data read speed (e.g., a 12x-speeddrive) will be demanded. A DVD-ROM apparatus typically uses an optical pick-up chip for reading out signals. The optical pick-up chip includes, on the same chip, a light-receiving device and a signal processing circuit for processing a photoelectrically converted signal from the light-receiving device. In order to further increase the operating speed of a DVD-ROM apparatus, there is a demand to increase the operating speed of the light-receiving device which is included in such an optical pick-up (more generically a "circuit-integrated light-receiving device").

Conventionally, a light-receiving device included in an optical pick-up employs a PN junction between an N-type epitaxial (semiconductor crystal growth) layer and a P-type substrate, or a PN junction between an N-type epitaxial layer and a P-type diffusion layer. However, when the former type of PN junction between an N-type epitaxial layer and a P-type substrate is used, a photo carrier generated in the substrate moves by diffusion, thereby reducing the response speed. On the other hand, when the latter PN junction between an N-type epitaxial layer and a P-type diffusion layer is used, the junction capacitance increases according to the impurity concentration in the N-type epitaxial layer, thereby also reducing the response speed. Moreover, when the latter PN junction is used in a DVD apparatus, a major portion of the laser light having a wavelength of 650 nm which is used by the DVD apparatus as reproduction light goes into the substrate, thereby reducing the operational sensitivity.

As described above, the conventional circuit-integrated light-receiving device is likely to have poor operational characteristics as compared with a pin photodiode which does not include a built-in circuit.

In order to solve these problems, a number of structures have been proposed in the art.

FIG. 26 illustrates a structure which is disclosed in Japanese Laid-Open Publication No. 61-154063. In this structure, a P-type epitaxial layer 142 is provided on the surface of a P+-substrate 141. The P-type epitaxial layer 142 includes a P-type high-impurity concentration layer (auto-doped layer) 142a and a P-type low-impurity concentration layer 142b. The P-type high-impurity concentration layer 142a is provided by an upward diffusion (auto-doping) of an impurity from the substrate 141 which occurs during the growth of the P-type epitaxial layer 142.

An N-type epitaxial layer 143 is provided on the P-type epitaxial layer 142. A P+-separation diffusion layer 144 having a high impurity concentration extends from the upper surface of the N-type epitaxial layer 143 to the underlying P-type epitaxial layer 142. The separation diffusion layer 144 divides the N-type epitaxial layer 143 into a number of regions and separates the regions from one another.

Some of the separated regions of the N-type epitaxial layer 143 each form a light-receiving device section 180. In particular, the light-receiving device section 180 includes a PN junction formed between one of the separated regions of the N-type epitaxial layer 143 and the underlying P-type epitaxial layer 142. Each of the other ones of the separated regions of the N-type epitaxial layer 143 which is adjacent to the light-receiving device section 180 forms a signal processing circuit section (NPN transistor) 190. In the illustrated example, the signal processing circuit section (NPN transistor) 190 includes a buried region 165 for reducing the collector resistance, a base region 147 and an emitter region 148. The light-receiving device section 180 and the signal processing circuit section 190 are electrically separated from each other by the separation diffusion layer 144.

An oxide layer 149 is provided on the upper surface of each of these structures. An electrical line layer 150a is connected to the contact region 145 of the light-receiving device section (photodiode) 180 via a contact hole provided in the oxide layer 149. An electrical line layer 150b and an electrical line layer 150c are connected to the signal processing circuit section (NPN transistor) 190 similarly via a contact hole. The electrical line layer 150b is also connected to the separation diffusion layer 144.

As described above, the structure illustrated in FIG. 26 includes the substrate 141 having a high impurity concentration and the P-type epitaxial layer 142 which has a lower impurity concentration. Thus, the depletion layer on the side of the P-type semiconductor which forms the photodiode (a region denoted by a one-dot chain line) is substantially extended into the P-type epitaxial layer 142, thereby reducing the junction capacitance of the photodiode 180. Due to the extension of the depletion layer, a photo carrier generated in a deep location can sufficiently contribute to the photoelectric current.

Moreover, a P-type high-impurity concentration layer (auto-doped layer) 142a included in this structure has a concentration gradient which gradually decreases in the upward direction from the substrate 141. A potential gradient is produced by the concentration gradient, which in turn generates an internal electric field, whereby it is possible to move at a high speed a photo carrier that is generated in a deep location (lower portion) of the P-type epitaxial layer 142.

Next, FIG. 27 illustrates a structure which is disclosed in Japanese Laid-Open Publication No. 4-271172. In the structure, a non-doped first epitaxial layer 224 is provided on a P-type substrate 223, and a P-type well region 226 is formed in a portion of the non-doped first epitaxial layer 224 corresponding to the location where a signal processing circuit section (NPN transistor) 290 is provided. An N-type second epitaxial layer 225 is provided on the first epitaxial layer 224. An N+-diffusion region 230 is provided in the light-receiving device section (photodiode) 280 in the vicinity of the surface of the N-type second epitaxial layer 225. Regions 235, 236 and 237 of the NPN transistor are provided in the signal processing circuit section 290 in the vicinity of the surface of the N-type second epitaxial layer 225. An N+-diffusion region 234 is provided below the regions 235, 236 and 237. The signal processing circuit section 290 and the photodiode section 280 are electrically separated from each other by a separation diffusion region 227 including two regions 228 and 229.

An oxide layer 231 is provided on the surface of each of the structures. Electrical line layers 232 and 233 are connected to the light-receiving device section (photodiode) 280 via a contact hole provided in the oxide layer 231. An electrical line layer 238 is connected to the signal processing circuit section (NPN transistor) 290 similarly via a contact hole.

The structure illustrated in FIG. 27 employs the substrate 223 having a specific resistance of about 40 Ωcm to about 60 Ω so as to control the auto-doping process from the substrate 223 to the overlying first epitaxial layer 224. Moreover, a non-doped semiconductor crystal layer is used as the overlying first epitaxial layer 224, whereby the depletion layer in the photodiode section 280 can extend by a substantial distance toward the substrate. Furthermore, the P-type well region 226 is provided, so that the NPN transistor is surrounded by the P-type regions, i.e., the separation diffusion region 227 (228 and 229) and the P-type well region 226, whereby it is possible to reduce the parasitic effect.

Next, FIG. 28 illustrates a structure which is disclosed in Japanese Laid-Open Publication No. 1-205564. The structure includes a P-type epitaxial layer 320 formed on the surface of a P+-substrate 310. The P-type epitaxial layer 320 includes a P-type auto-doped layer 321 and a P-type low-impurity concentration layer 322. The P-type auto-doped layer 321 is provided by an upward diffusion (auto-doping) of an impurity from the substrate 310 which occurs during the growth of the P-type epitaxial layer 320.

An N-type epitaxial layer 330 is provided on the P-type epitaxial layer 320. A P+-separation diffusion region 340 having a high impurity concentration extends from the upper surface of the N-type epitaxial layer 330 into the auto-doped layer 321 of the P-type epitaxial layer 320. The separation diffusion region 340 divides the N-type epitaxial layer 330 into a number of regions and separates the regions from one another.

Some of the separated regions of the N-type epitaxial layer 330 each form a light-receiving device section 380. In particular, the light-receiving device section 380 includes a PN junction formed between one of the separated regions of the N-type epitaxial layer 330 and the underlying P-type epitaxial layer 320. An N+-type diffusion layer 334 which functions as a light receiving surface electrode extends over a relatively large area in the light-receiving device section 380 in the vicinity of the N-type epitaxial layer 330. Each of the other ones of the separated regions of the N-type epitaxial layer 330 which is adjacent to the light-receiving device section 380 forms a signal processing circuit section (NPN transistor) 390. In the illustrated example, the signal processing circuit section (NPN transistor) 390 includes a buried region 323 for reducing the collector resistance, a P-type diffusion layer 331 and an N+-type diffusion layer 333. The light-receiving device section 380 and the signal processing circuit section 390 are electrically separated from each other by the separation diffusion region 340.

An insulation film 335 is provided on the upper surface of each of these structures. Electrode and line elements 336 and 337 are electrically connected to predetermined locations of the light-receiving device section 380 and the signal processing circuit section 390 via contact holes provided in the insulation film 335.

In the structure illustrated in FIG. 28, the light-receiving device section 380 and the adjacent signal processing circuit section 390 are electrically separated from each other by the deep separation diffusion region 340. As a result, the depletion layer formed in the light-receiving device section 380 can extend by a substantial distance toward the substrate (i.e., into the auto-doped layer 321 of the P-type epitaxial layer 320) without extending into other adjacent photodiode and signal processing circuit sections.

Typically, the response characteristic of a photodiode is dependent on the Junction capacitance provided by the PN junction and the series resistance which is determined by the resistance component of each portion of the photodiode.

Among others, the junction capacitance is basically determined by the impurity concentration of the substrate. Therefore, the junction capacitance can generally be improved by using a high-specific-resistance substrate having a low impurity concentration. In the conventional structures illustrated in FIGS. 26 to 28, the junction capacitance is improved either by suppressing the impurity concentration of the P-type epitaxial layer provided on the substrate or by increasing the resistance thereof by making the layer non-doped.

In the structures illustrated in FIGS. 26 and 27, the junction capacitance is improved as described above, but the series resistance is not sufficiently improved. This will be further described below.

Generally, it is believed that the series resistance of a photodiode includes the following components R1–R7:

R1: The resistance of the separation diffusion region

R2: The resistance of the buried diffusion layer underlying the separation diffusion region R3: The resistance of the high-specific-resistance epitaxial layer underlying the separation diffusion region R4: The resistance of the auto-doped layer underlying the separation diffusion region R5: The substrate resistance R6: The resistance of the auto-doped layer underlying the photodiode section R7: The resistance of the high-specific-resistance epitaxial layer underlying the photodiode section (for R1–R7, see FIGS. 6A and 6B or FIGS. 17A and 17B).

The series resistance of the photodiode section of each of the conventional structures will now be discussed. In each of the conventional structures, the separation diffusion region has a high impurity concentration, whereby the resistance R1 is low. Moreover, the substrate has a high impurity concentration, whereby the substrate resistance R5 is low. The resistances R4 and R6 of the auto-doped layer provided by a diffusion of an impurity from the substrate do not significantly affect the series resistance. Moreover, judging from the structure of the buried diffusion layer, the resistance R2 of the buried diffusion layer either does not exist (FIGS. 26 and 28) or does not substantially contribute to the series resistance of the photodiode (FIG. 27).

However, in the structure illustrated in FIG.ure 26, the high-specific-resistance epitaxial layer 142b underlying the separation diffusion layer 144 has a low impurity concentration, whereby the resistance R3 thereof is high. Moreover, a portion of the high-specific-resistance epitaxial layer 142b underlying the separation diffusion layer 144 may be depleted by an influence of a bias voltage applied across the photodiode due to the low impurity concentration, thereby further increasing the resistance R3. This is true also in the structure illustrated in FIG. 27, where the resistance R3 of the non-doped first epitaxial layer 224 underlying the separation diffusion region 227 is high.

For the foregoing reasons, each of the conventional structures illustrated in FIGS. 26 and 27 has a reduced photodiode junction capacitance, but has a high series resistance due to the high resistance component of the low-concentration or non-doped P-type epitaxial layer underlying the N-type epitaxial layer, thereby lowering the response speed of the photodiode.

On the contrary, the structure illustrated in FIG. 28 employs the high-impurity concentration substrate 310, thereby reducing the substrate resistance R5, while employing the deep separation diffusion region 340 which reaches the auto-doped layer 321 having a high impurity concentration, thereby eliminating the resistance component R3. Moreover, the resistance component R7 underlying the photodiode section can similarly be eliminated by extending the depletion layer to the auto-doped layer 321. As a result, the structure overcomes the problem of a high series resistance, thereby improving the response speed.

However, when the separation diffusion region 340 is extended to such a depth, as in the structure illustrated in FIG. 28, the diffusion step diffuses the impurity in the lateral direction as well as the depth direction. Therefore, the width of the separation diffusion region 340 increases as well as the depth thereof. Such an increase in the lateral size of the separation diffusion region 340 will naturally increase the size of the entire device. This is undesirable in view of the increasing demand in the art to reduce the device size.

Moreover, when a separation diffusion region extends deeply in the structure, as schematically illustrated in FIG. 29B, the distance by which a photo carrier generated under the separation diffusion region moves naturally increases as compared to the case of a shallow separation diffusion region as illustrated in FIG. 29A, thereby lowering the response speed of the photodiode. The problem due to the formation of the deep separation diffusion region is particularly pronounced when the structure is used in a split photodiode, as discussed in, for example, Japanese Laid-Open Publication No. 8-32100.

Moreover, in the conventional structure illustrated in FIG. 28, the separation diffusion region 340, which contributes to the reduction in the series resistance of the photodiode, is provided only in the device separation portion. Therefore, it is necessary to increase the impurity concentration of the separation diffusion region 340 in order to reduce the resistance value. In particular, in order to obtain an impurity concentration of about $1 \times 10^{16}$ atoms/cm$^3$ in the vicinity of the boundary between the separation diffusion region 340 and the auto-doped layer 321, it is necessary to set the impurity concentration on the surface of the P-type buried diffusion layer of the separation diffusion region 340 in a range of about $1 \times 10^{18}$ atoms/cm$^3$ to about $1 \times 10^{19}$ atoms/cm$^3$.

When forming the N-type epitaxial layer 330, the impurity on the surface of the P-type buried diffusion layer of the separation diffusion region 340 is auto-doped, thereby forming an auto-doped layer. The impurity concentration of such an auto-doped layer is typically about $10^{-3}$ of that of the auto-dope source. In the example illustrated in FIG. 28, the impurity concentration on the surface of the P-type buried diffusion layer of the separation diffusion region 340 is about $1 \times 10^{18}$ atoms/cm$^3$ to about $1 \times 10^{19}$ atoms/cm$^3$, whereby an auto-doped layer formed on the surface of the P-type epitaxial layer 320 has an impurity concentration of about $1 \times 10^{16}$ atoms/cm$^3$. In the P-type epitaxial layer 320, which forms the PN junction of the photodiode, the impurity concentration in the vicinity of the PN junction is preferably about $1 \times 10^{13}$ atoms/cm$^3$ to about $1 \times 10^{14}$ atoms/cm$^3$ in order to obtain a reduced junction capacitance. Therefore, when an auto-doped layer having a high impurity concentration as described above exists in the vicinity of the PN junction, the extension of the depletion layer is restricted, thereby increasing the junction capacitance and thus lowering the response speed of the photodiode.

As schematically illustrated in FIGS. 30A and 30B, the auto-doped layer provided in the vicinity of the PN junction also has a substantial influence on the movement of a carrier (electron) generated in the P-type substrate.

In particular, if no auto-doped layer exists on the surface of the P-type substrate (herein, it is assumed that the P-type substrate also includes the P-type epitaxial layer formed on the substrate), i.e., in the vicinity of the PN junction, a carrier (electron) generated in the P-type substrate can move into the N-type epitaxial layer without having to overcome a barrier, as illustrated in FIG. 30A. However, if an auto-doped layer exists on the surface of the P-type substrate (in the vicinity of the PN junction), the auto-doped layer acts as a potential barrier for an electron, thereby restricting the movement of the electron from inside the P-type substrate to the N-type epitaxial layer, as illustrated in FIG. 30B, thereby lowering the response speed of the photodiode. Therefore, unless the impurity concentration on the surface of the P-type buried diffusion layer of the separation diffusion region 340 is set to a level such that an auto-doped layer will not be formed in the vicinity of the PN junction by autodoping, the response speed of the photodiode cannot be improved sufficiently.

As described above, it has not been possible in the prior art to obtain a structure capable of achieving a sufficiently high photodiode response speed, while reducing the junction capacitance of the photodiode and the series resistance.

SUMMARY OF THE INVENTION

According to one aspect of this invention, a circuit-integrated light-receiving device includes: a semiconductor substrate of a first conductivity type; a first semiconductor crystal growth layer of the first conductivity type provided on a surface of the semiconductor substrate, wherein the first semiconductor crystal growth layer includes a first portion whose impurity concentration gradually decreases in a direction away from the surface of the semiconductor substrate and a second portion located in a first region above the first portion whose impurity concentration distribution is uniform in a depth direction; a buried diffusion layer of the first conductivity type located in a second region which is above the first portion of the first semiconductor crystal growth layer and does not overlap the first region; a second semiconductor crystal growth layer of a second conductivity type which is provided across a surface of the first semiconductor crystal growth layer and a surface of the buried diffusion layer; and a separation diffusion region having the first conductivity type for dividing the second semiconductor crystal growth layer into a light-receiving device section and a signal processing circuit section. The first region is located in the light-receiving device section. In the signal processing circuit section, the buried diffusion layer is in contact with the first portion of the first semiconductor crystal growth layer.

According to another aspect of this invention, a circuit-integrated light-receiving device includes: a semiconductor substrate of a first conductivity type; a first semiconductor crystal growth layer of the first conductivity type provided on a surface of the semiconductor substrate, wherein the first semiconductor crystal growth layer includes a first portion whose impurity concentration gradually decreases in a direction away from the surface of the semiconductor substrate and a second portion located in a first region above the first portion whose impurity concentration distribution is uniform in a depth direction; a buried diffusion layer of the first conductivity type located in a second region which is above the first portion of the first semiconductor crystal growth layer and does not overlap the first region; a second semiconductor crystal growth layer of a second conductivity type which is provided across a surface of the first semiconductor crystal growth layer and a surface of the buried diffusion layer; and a separation diffusion region having the first conductivity type for dividing the second semiconductor crystal growth layer into a light-receiving device section and a signal processing circuit section. The first region is located in the light-receiving device section. A width W of the buried diffusion layer and a thickness T of the first semiconductor crystal growth layer are set to satisfy a relationship:

$$W>2T.$$

In one embodiment of the invention, the first, conductivity type is a P type, and an impurity concentration of the semiconductor substrate is about $1\times10^{16}$ atoms/cm$^3$ or less.

In one embodiment of the invention, the first conductivity type is a P type, and an impurity concentration at an interface between the buried diffusion layer and the first portion of the first semiconductor crystal growth layer is about $1\times10^{13}$ atoms/cm$^3$ or more.

In one embodiment of the invention, the first conductivity type is a P type, and a surface impurity concentration of the buried diffusion layer in the separation diffusion region is about $1\times10^{16}$ atoms/cm$^3$ or less.

In one embodiment of the invention, the circuit-integrated light-receiving device further includes an impurity layer of a first conductivity type between the semiconductor substrate and the first semiconductor crystal growth layer.

In one embodiment of the invention, the first conductivity type is a P type, and an impurity concentration of the impurity layer is in a range of about $1\times10^{16}$ atoms/cm$^3$ to about $1\times10^{19}$ atoms/cm$^3$.

In one embodiment of the invention, an impurity concentration and a thickness of the first semiconductor crystal growth layer are adjusted so that a depletion layer extends through the first semiconductor crystal growth layer to reach the first portion of the first semiconductor crystal growth layer when a bias voltage is applied across the light-receiving device including the second semiconductor crystal growth layer and the first semiconductor crystal growth layer.

In one embodiment of the invention, the circuit-integrated light-receiving device further includes an electrode on a reverse side of the semiconductor substrate, wherein the electrode is connected to a terminal of a light-receiving device provided in the light-receiving device section.

In one embodiment of the invention, the first portion of the first semiconductor crystal growth layer is an auto-doped layer which is formed by an auto-doping of an impurity from the semiconductor substrate.

In one embodiment of the invention, the light-receiving device section is divided into a number of regions, thereby providing a split photodiode including the same number of photodiode portions.

In one embodiment of the invention, a length of the buried diffusion layer is set to be equal to or greater than that of the light-receiving device section.

In one embodiment of the invention, the buried diffusion layer is provided so as not to extend beyond an overlying buried separation diffusion layer toward the light-receiving device section.

In one embodiment of the invention, one or more buried separation diffusion layer is provided in an upper portion of the buried diffusion layer in addition to another buried separation diffusion layer which is provided in an extension diffusion portion at an end thereof.

In one embodiment of the invention, the buried diffusion layer is provided across an entire area of a portion of the circuit-integrated light-receiving device which is in a vicinity of one of the photodiode portions requiring a high response speed and which is not irradiated with light.

The present invention having such features provides a circuit-integrated light-receiving device in which a signal processing circuit section is provided adjacent to a photodiode section (light-receiving device section) which is provided by using a PN junction between a first semiconductor crystal growth layer of a first conductivity type (e.g., a P-type epitaxial layer) and a second semiconductor crystal growth layer of a second conductivity type (e.g., an N-type epitaxial layer). A buried diffusion layer is provided to extend from the surface of the N-type epitaxial layer of the signal processing circuit section into the P-type epitaxial layer so as to contact an auto-doped layer (a first portion) of the P-type epitaxial layer. As a result, a P-type high-specific-resistance layer (i.e., a second portion of the P-type epitaxial layer (the first semiconductor crystal growth layer) which has a uniform impurity concentration distribution) does not exist between the buried diffusion layer and the auto-doped layer. Thus, it is possible to reduce the series resistance of the produced photodiode.

A device which satisfies the desired specification can be obtained by setting the impurity concentration value at the location where the buried diffusion layer and the auto-doped layer contact each other to be equal to or greater than a concentration value (e.g., about $1\times10^{13}$ atoms/cm$^3$ or more for a P type), which is calculated from the response speed characteristic value (e.g., a cut-off frequency) required for the photodiode.

Moreover, the formation of the auto-doped layer in the vicinity of the PN junction can be suppressed by setting the impurity concentration of the substrate to a level (e.g., about $1\times10^{16}$ atoms/cm$^3$ or less in the case. of the P type) such that the influence of the impurity auto-doping from the substrate to the P-type epitaxial layer, which occurs during a process of forming the N-type epitaxial layer, is negligible. In this way, the restriction of the extension of the depletion layer formed in the photodiode section and the formation of the potential barrier for an electron at the PN junction, which present a problem when an auto-doped layer exists in the vicinity of the PN junction, can be suppressed, thereby preventing the response speed of the photodiode from lowering.

Similar to the impurity concentration of the substrate, it is also preferred to set the surface impurity concentration of the buried diffusion layer in the separation diffusion region to about $1\times10^{16}$ atoms/cm$^3$ or less to suppress the influence of the auto-doping on the P-type epitaxial layer.

Moreover, when a P-type high-impurity concentration layer is provided between the substrate and the P-type epitaxial layer by introducing a high concentration of P-type impurity such as boron, the local variation in the specific resistance (impurity concentration) of the auto-doped layer occurring due to the variation in the specific resistance of the substrate is suppressed, thereby suppressing the possibility of a variation occurring in the operational characteristics of the photodiode. In such a case, it is not necessary to increase the impurity concentration of the substrate itself (i.e., decrease the substrate resistance) for the purpose of reducing the series resistance of the photodiode, whereby it is possible to use a substrate having a low impurity concentration. As a result, it is possible to suppress the influence of the auto-doping as well as to cut off the carrier generated in a deep location in the substrate by the potential barrier provided as a result of the formation of the P-type high-impurity concentration layer. Thus, the response speed of the photodiode can further be improved.

When the impurity layer is a P-type layer, even if the impurity concentration is set to, for example, about $1 \times 10^{16}$ atoms/cm$^3$ or more, no auto-doped layer will be generated on the surface of the P-type high-specific-resistance epitaxial layer because the impurity layer is capped by the P-type high-specific-resistance epitaxial layer being deposited thereon. The concentration of the impurity layer is preferably high, e.g., about $1 \times 10^{19}$ atoms/cm$^3$ or less, within a range for which the device can normally be produced.

The junction capacitance of the photodiode section can be improved by setting the thickness and the specific resistance of the P-type high-specific-resistance epitaxial layer so that the depletion layer formed in the photodiode section contacts the auto-doped layer. Moreover, if an electrode (e.g., an anode electrode) is provided also on the reverse side of the substrate and is connected to a terminal (e.g., an anode terminal) which is formed in the light-receiving device section on the side of the structure opposite to the substrate, it is possible to reduce the resistance components shown in FIG. 6A such as R1 (the resistance of the separation diffusion region), R2 (the resistance of the buried diffusion layer underlying the separation diffusion region) and R4 (the resistance of the auto-doped layer underlying the separation diffusion region), as compared to the case where an anode electrode is provided only on the side of the structure opposite to the substrate.

Moreover, the present invention also provides a circuit-integrated light-receiving device in which a signal processing circuit section is provided adjacent to a photodiode section (light-receiving device section) which is provided by using a PN junction between a first semiconductor crystal growth layer of a first conductivity type (e.g., a P-type epitaxial layer) and a second semiconductor crystal growth layer of a second conductivity type (e.g., an N-type epitaxial layer), wherein the first semiconductor crystal growth layer (a high-specific-resistance epitaxial layer) which includes a first portion (an auto-doped layer) where the impurity concentration gradually decreases in a direction away from the surface of the semiconductor substrate and a second portion (a low-impurity concentration layer) having a uniform impurity concentration distribution in the depth direction. Thus, it is possible to reduce the junction capacitance of the photodiode.

The width W of the buried diffusion layer having the first conductivity type and the thickness T of the first semiconductor crystal growth layer are preferably set to satisfy the relationship.

$$W > 2T$$

Then, even if the impurity concentration on the surface of the buried diffusion. Layer of the separation diffusion region is set to a level such that the junction capacitance will not increase due to the auto-doping, it is possible to reduce the series resistance of the photodiode and to ensure a sufficient response speed of the photodiode.

The width W of the buried diffusion layer as used herein refers to an extent of the buried diffusion layer In the horizontal direction of FIG. 11.

Moreover, in order to reduce the series resistance of the photodiode, it is necessary to increase the cross-sectional area by which the buried diffusion layer and the auto-doped layer contact each other. Therefore, the length of the buried diffusion layer is preferably greater than the length of the light-receiving device section (photodiode).

The length L of the buried diffusion layer as used herein refers to an extent of the buried diffusion layer in the vertical direction of FIG. 18.

Moreover, where the buried diffusion layer extends beyond the overlying buried separation diffusion layer toward the light-receiving device section, if the extension is irradiated with light, a photo carrier moves by diffusion, thereby causing problems such as a reduction in the response speed. Therefore, the buried diffusion layer is preferably provided so as not to extend beyond the overlying buried separation diffusion layer toward the light-receiving device section.

Moreover, where the buried separation diffusion layer is provided only in an extension diffusion portion (i.e., a lateral diffusion portion) at an end of the buried diffusion layer, the contact between the extension diffusion portion of the buried diffusion layer and the auto-doped layer will be insufficient, thereby increasing the resistance of the contact portion. Thus, the series resistance of the photodiode may increase, thereby lowering the response speed. Therefore, one or more buried separation diffusion layers is preferably provided in a portion of the buried diffusion layer where it uniformly contacts the auto-doped layer other than the extension diffusion portion of the buried diffusion layer.

Moreover, in the case of a split photodiode, a high response speed characteristic is not necessary for all of the photodiode portions. Instead, the buried diffusion layer which satisfies the relationship:

$$W > 2T$$

is preferably provided only in the photodiode portion which requires a high response speed characteristic. In some cases, however, a sufficient width of the photodiode cannot be ensured due to optical design limitations. In such a case, the buried diffusion layer may be provided across the entire surface in the vicinity of the photodiode portion which requires a high response speed and which will not be irradiated with light.

Thus, the invention described herein makes possible the advantage of providing a circuit-integrated light-receiving device having a photodiode section having a sufficiently high response speed while reducing the junction capacitance of the photodiode and the series resistance.

This and other advantages of the present invention will become apparent to those skilled in the art upon reading and understanding the following detailed description with reference to the accompanying figures.

Figure 1:
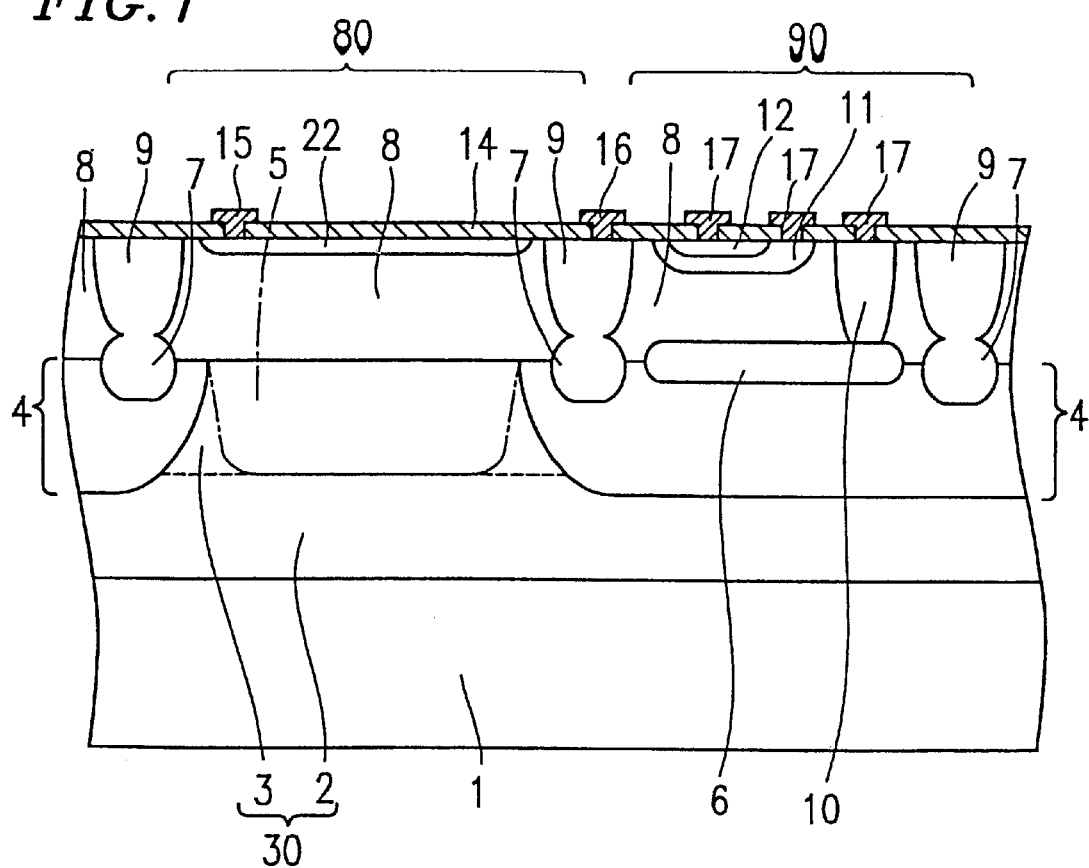
FIG. 1 is a cross-sectional view illustrating a structure of a circuit-integrated light-receiving device according to Embodiment 1 of the present invention.
Figure 2A:
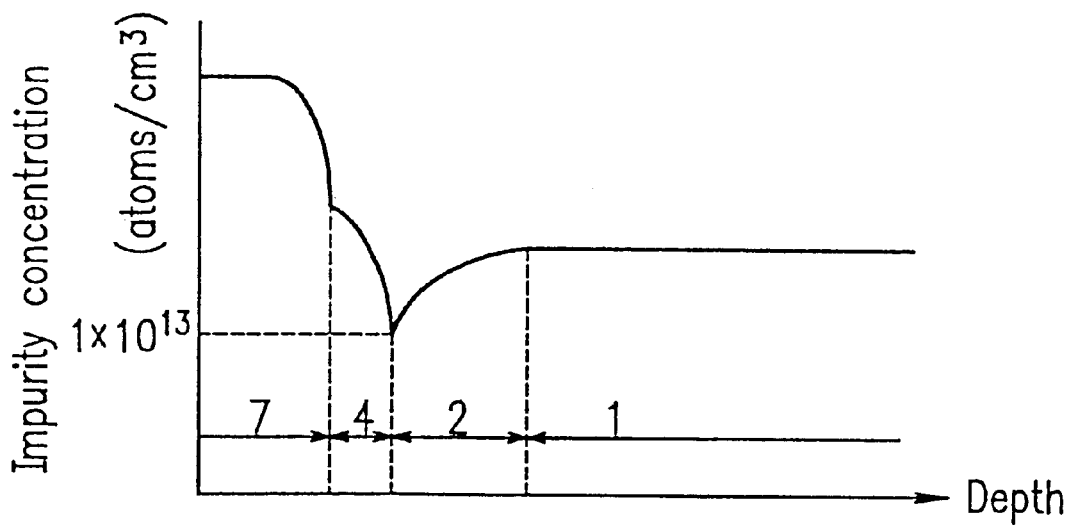
Figure 2B:
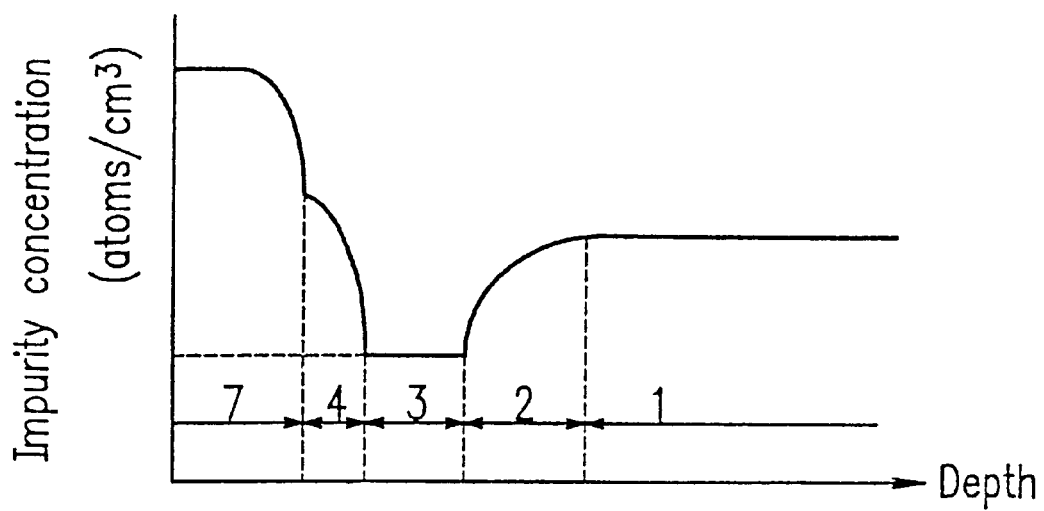
Figure 3:
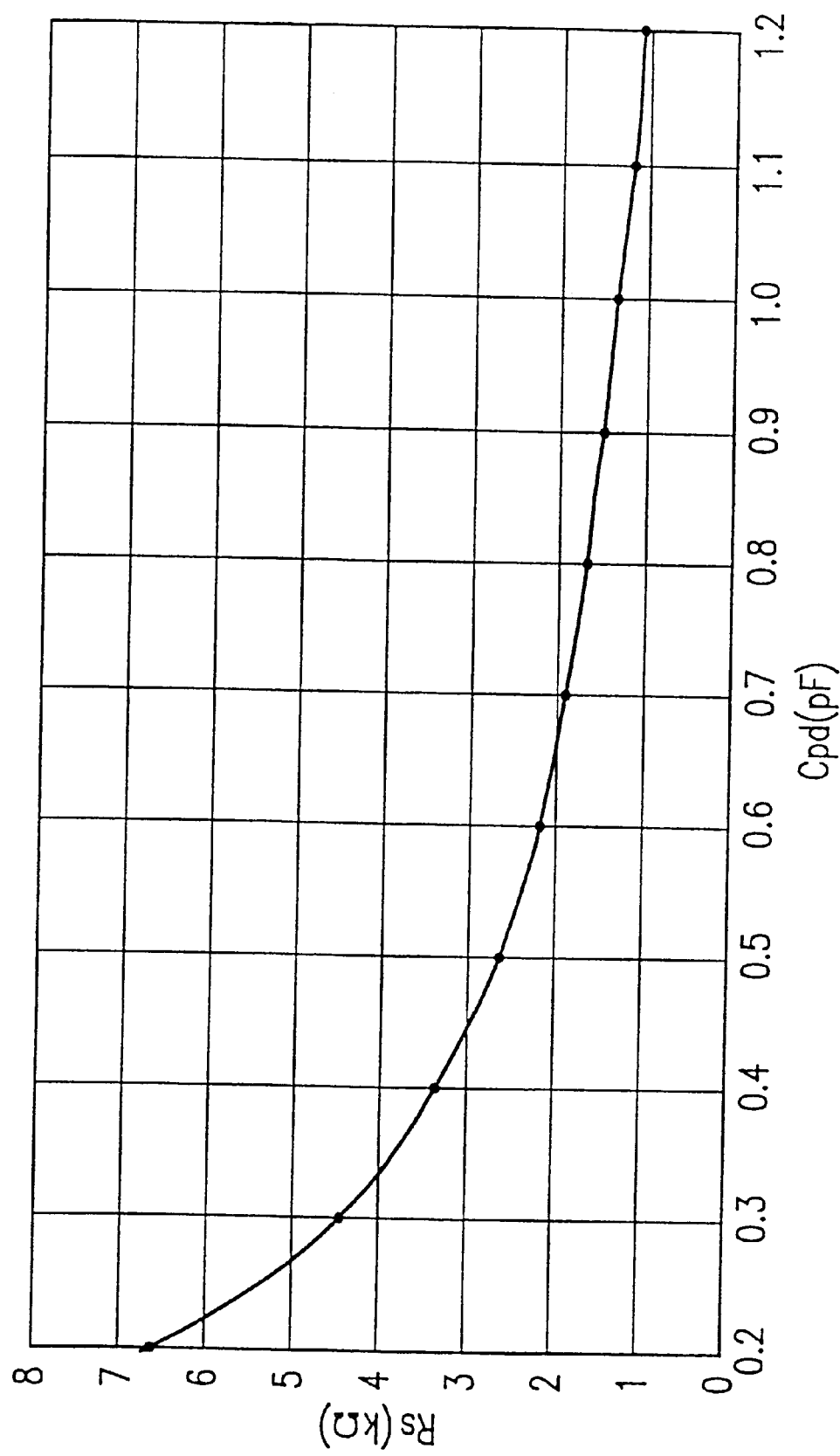
Figure 4:
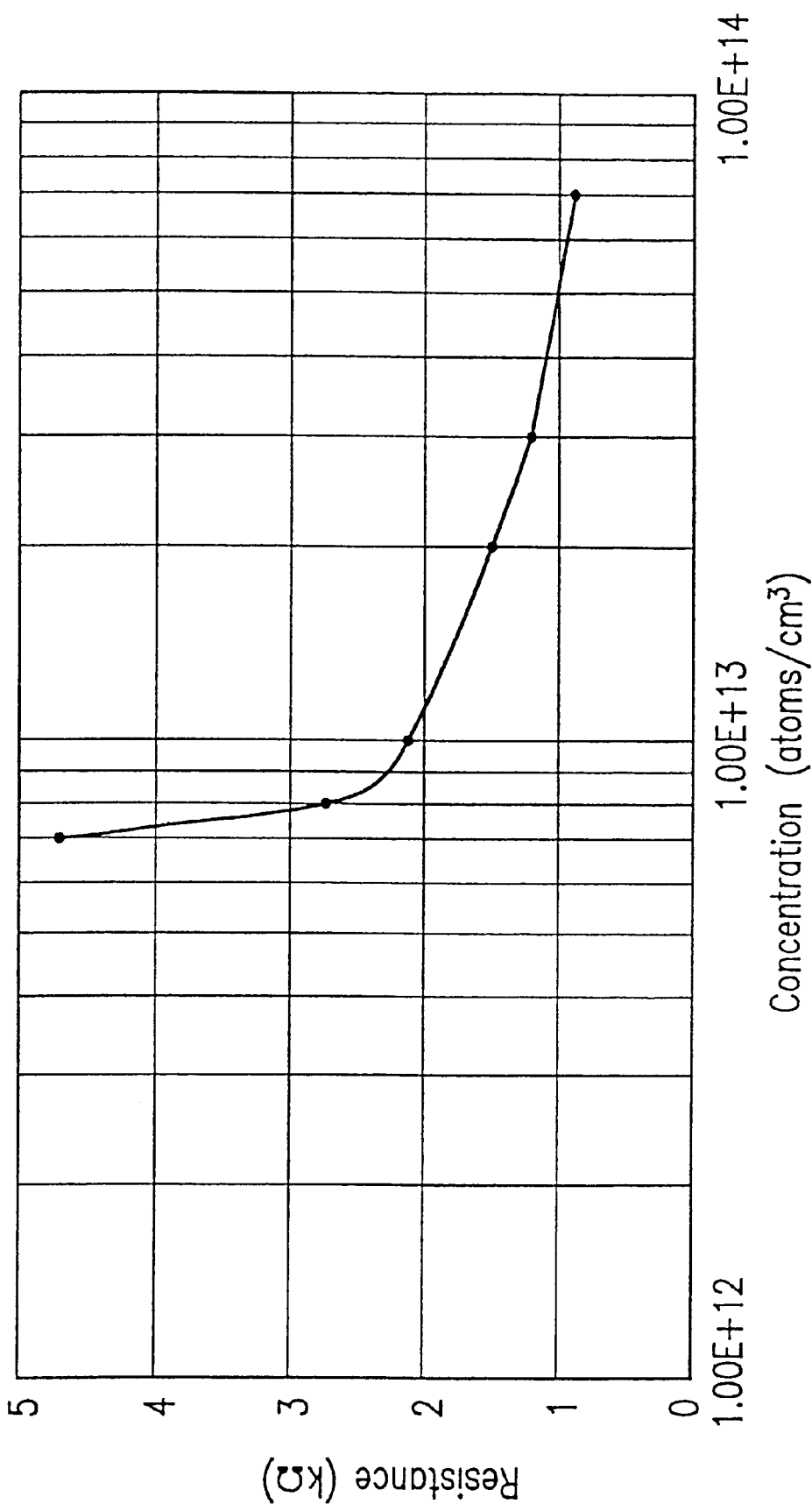
Figure 6A:
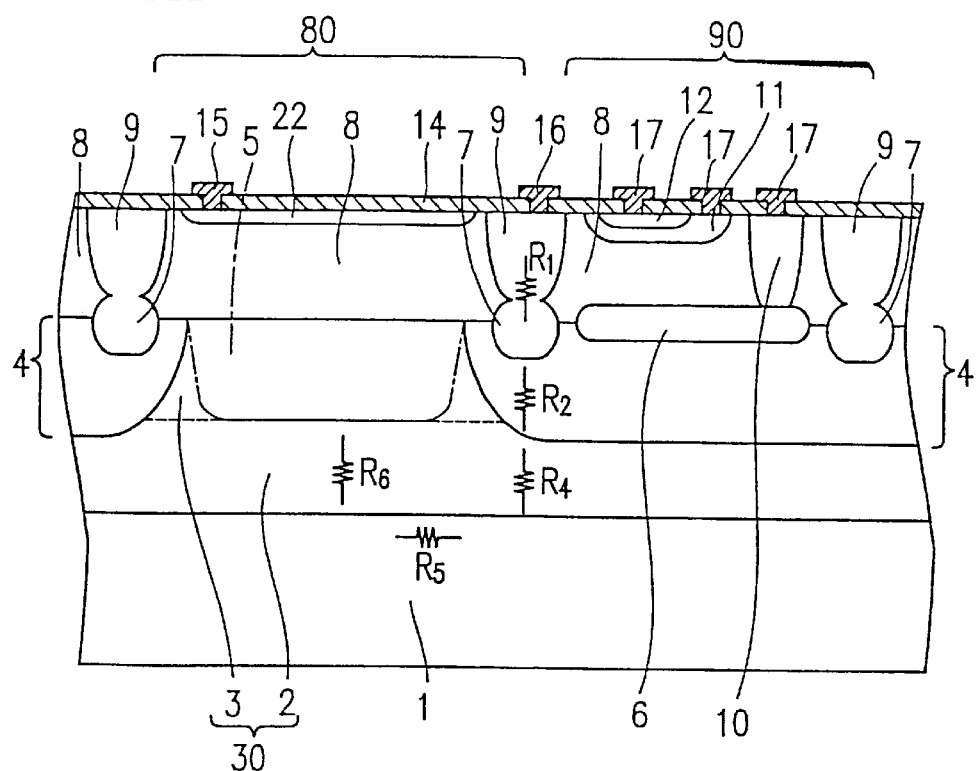
Figure 6B:
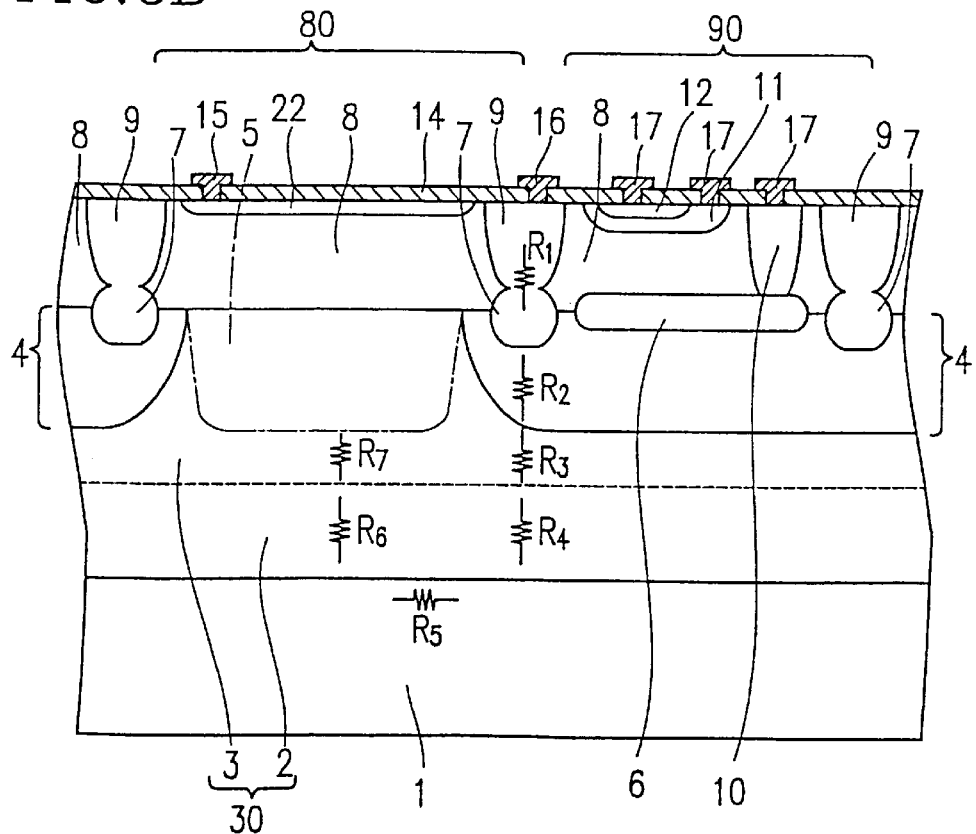
Figure 7:
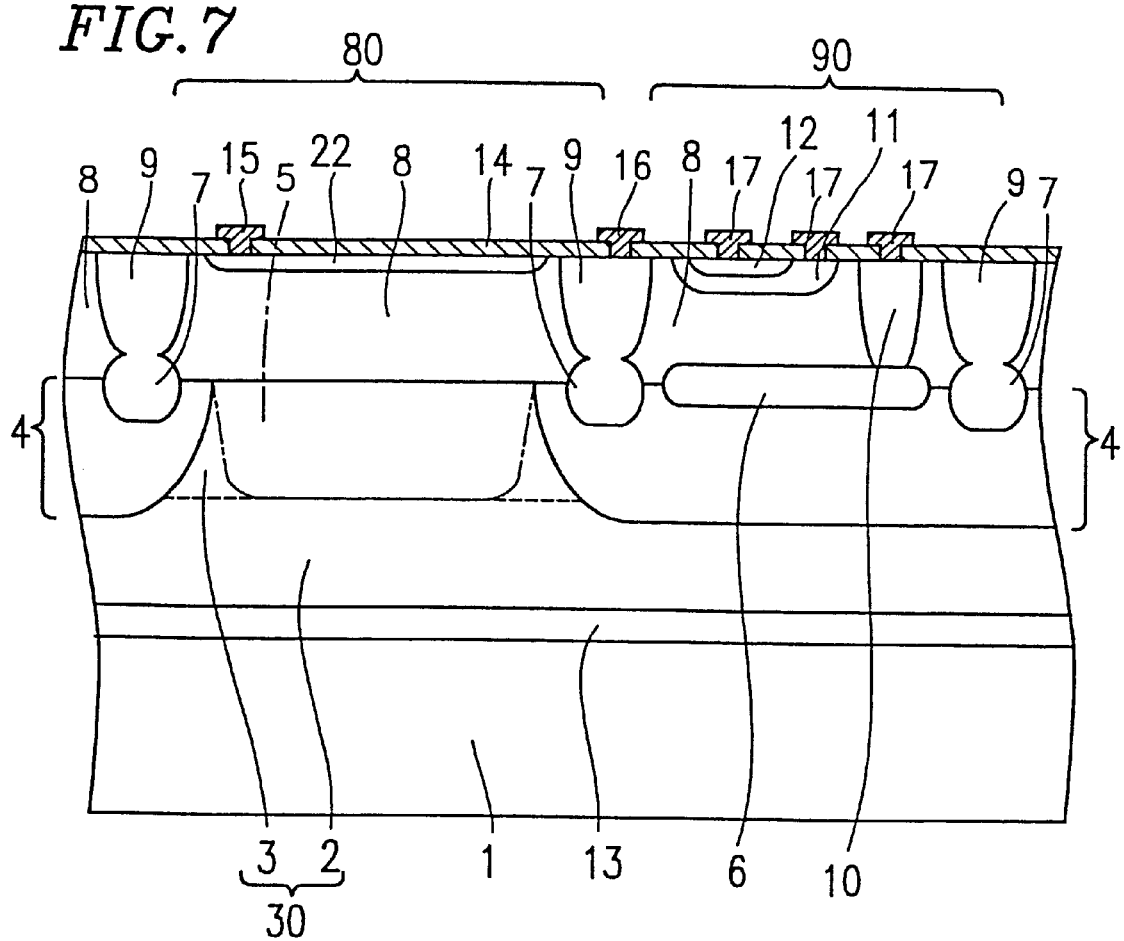
Figure 8:
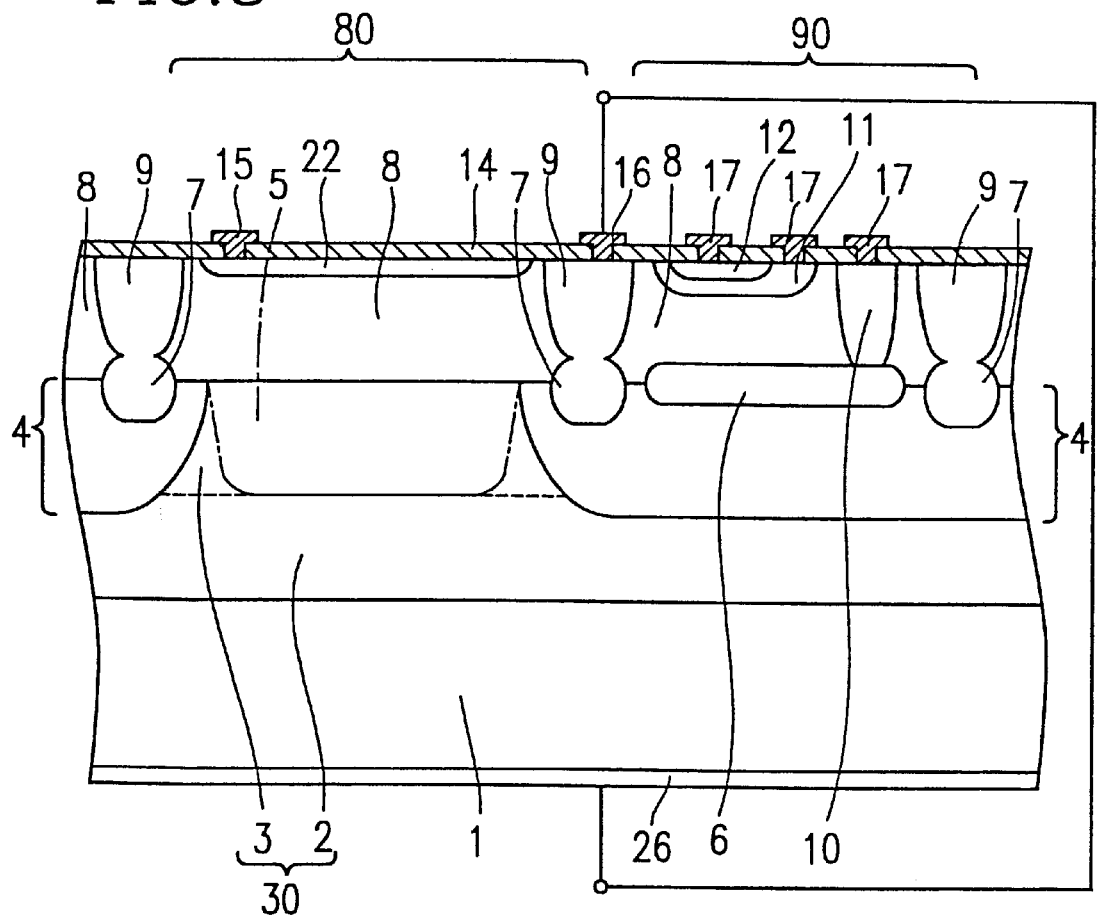
Figure 9:
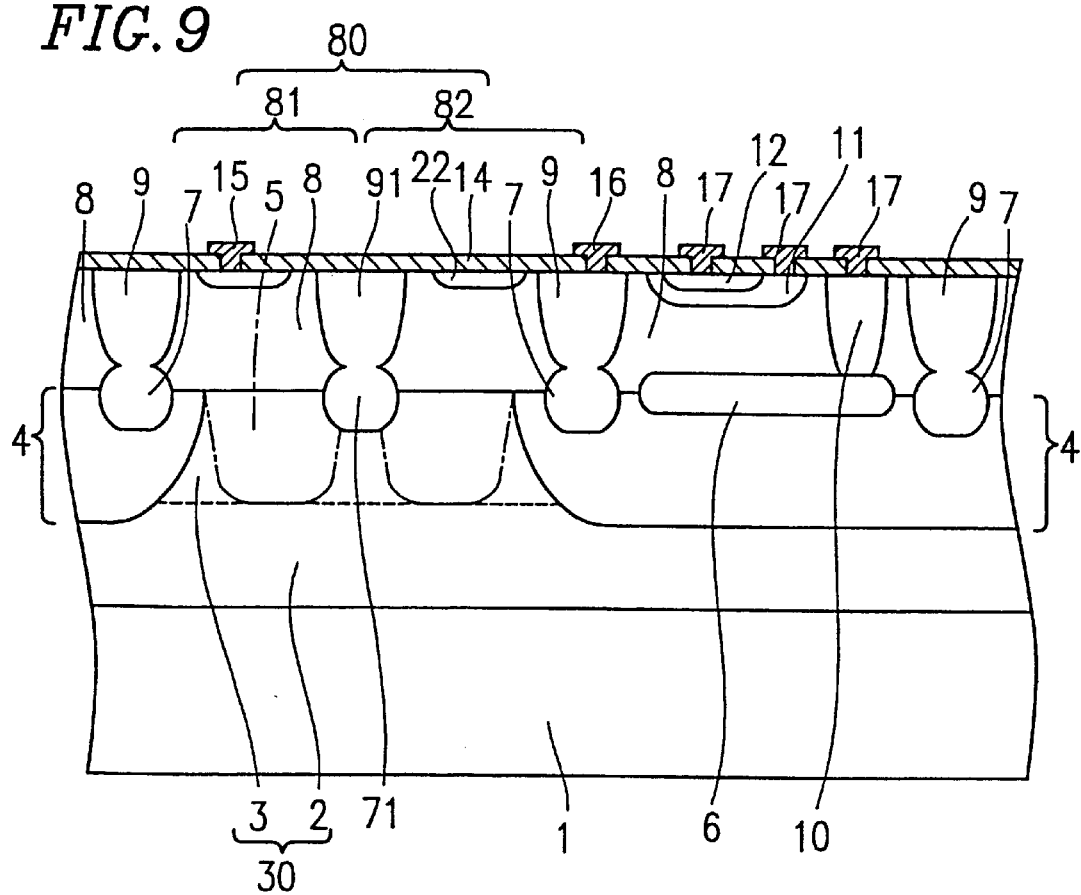
Figure 10:
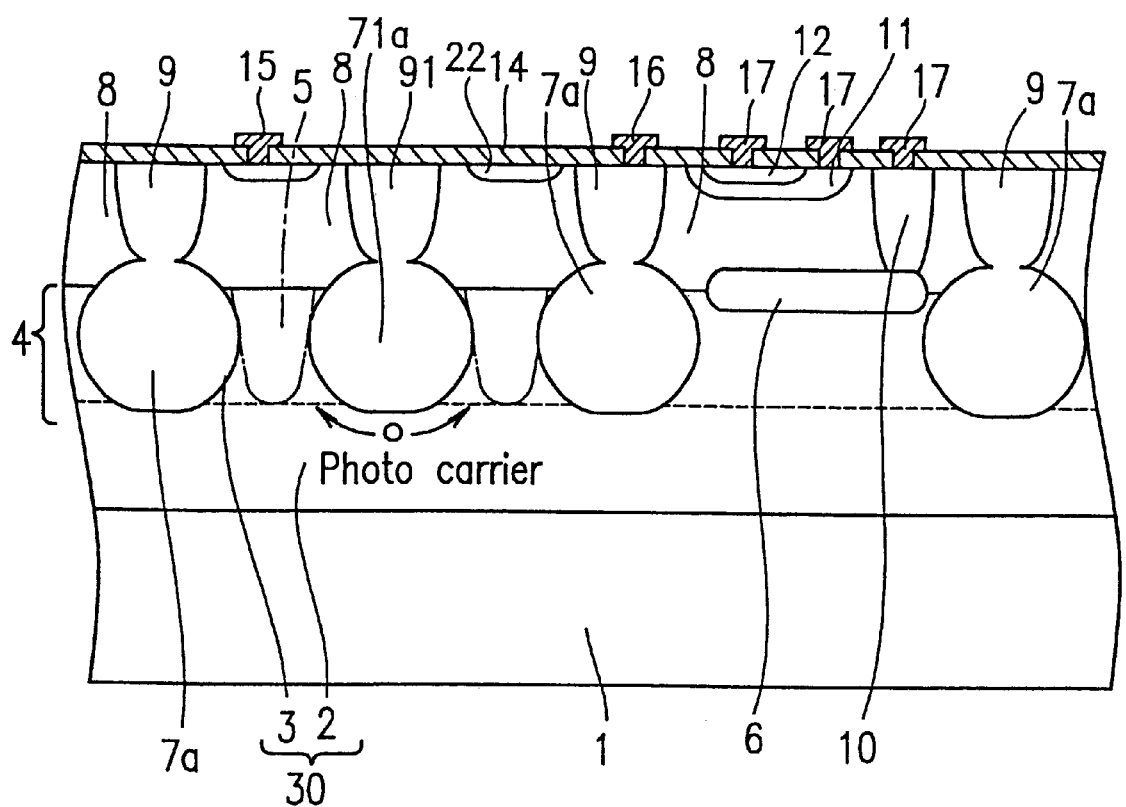
Figure 11:
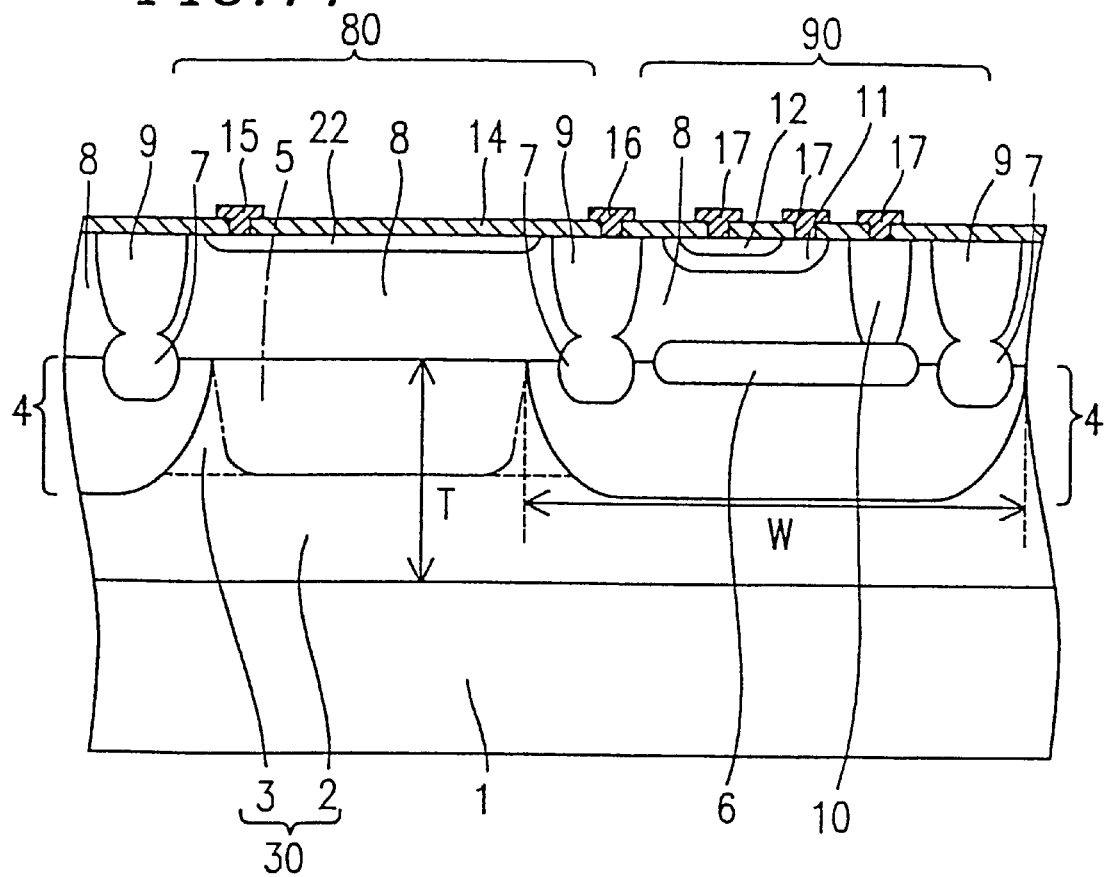
Figure 12:
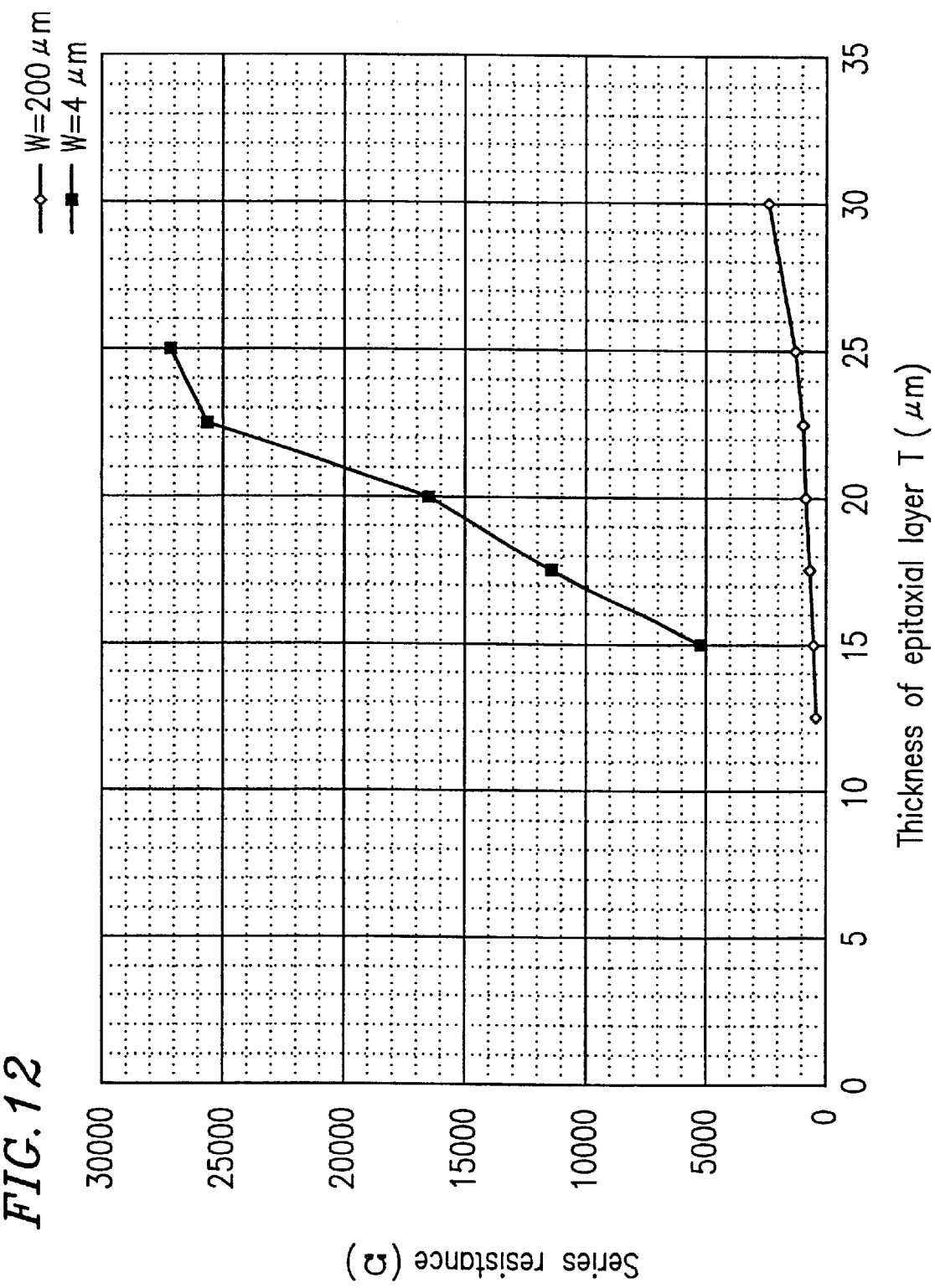
Figure 13:
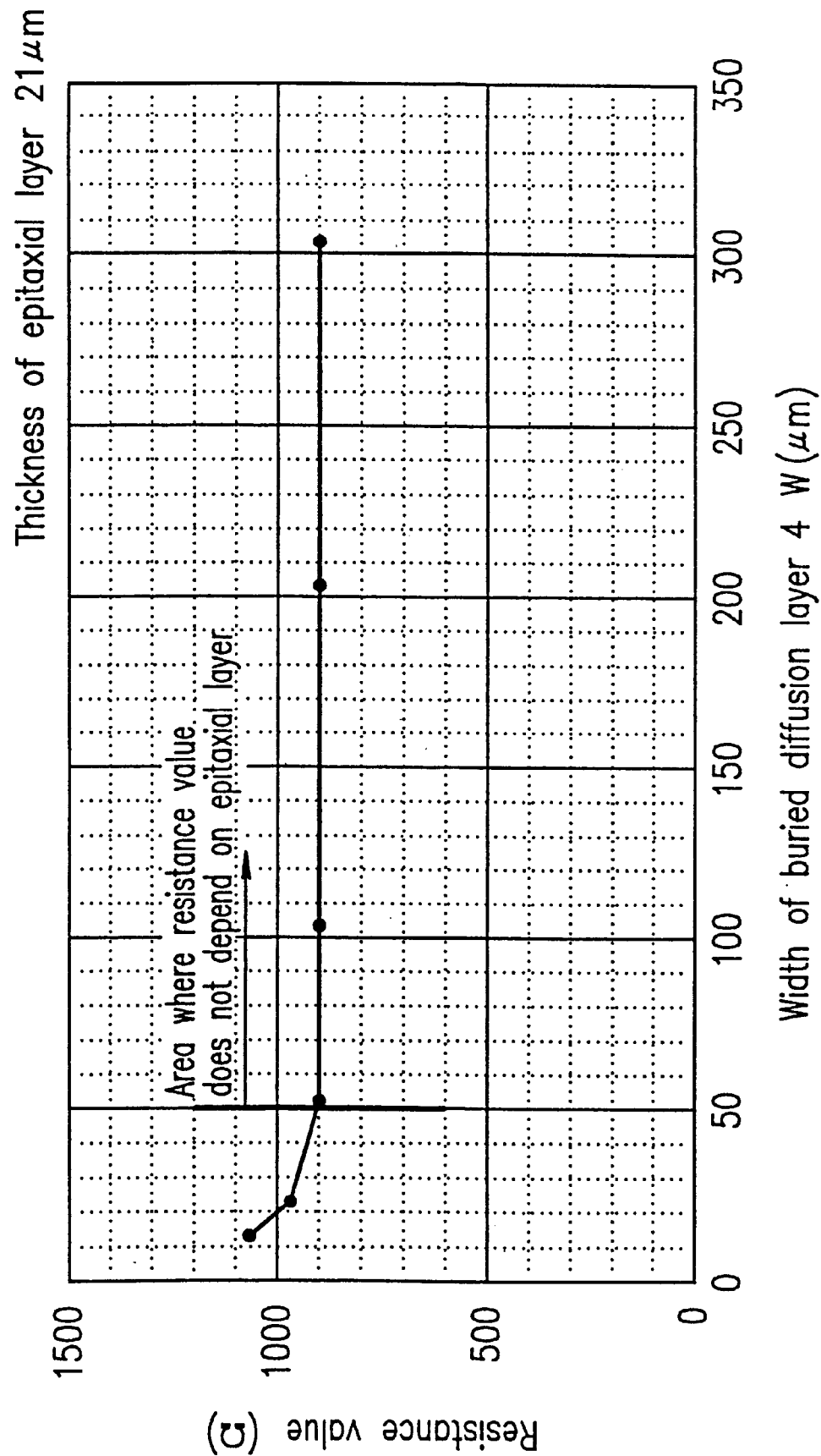
Figure 14:
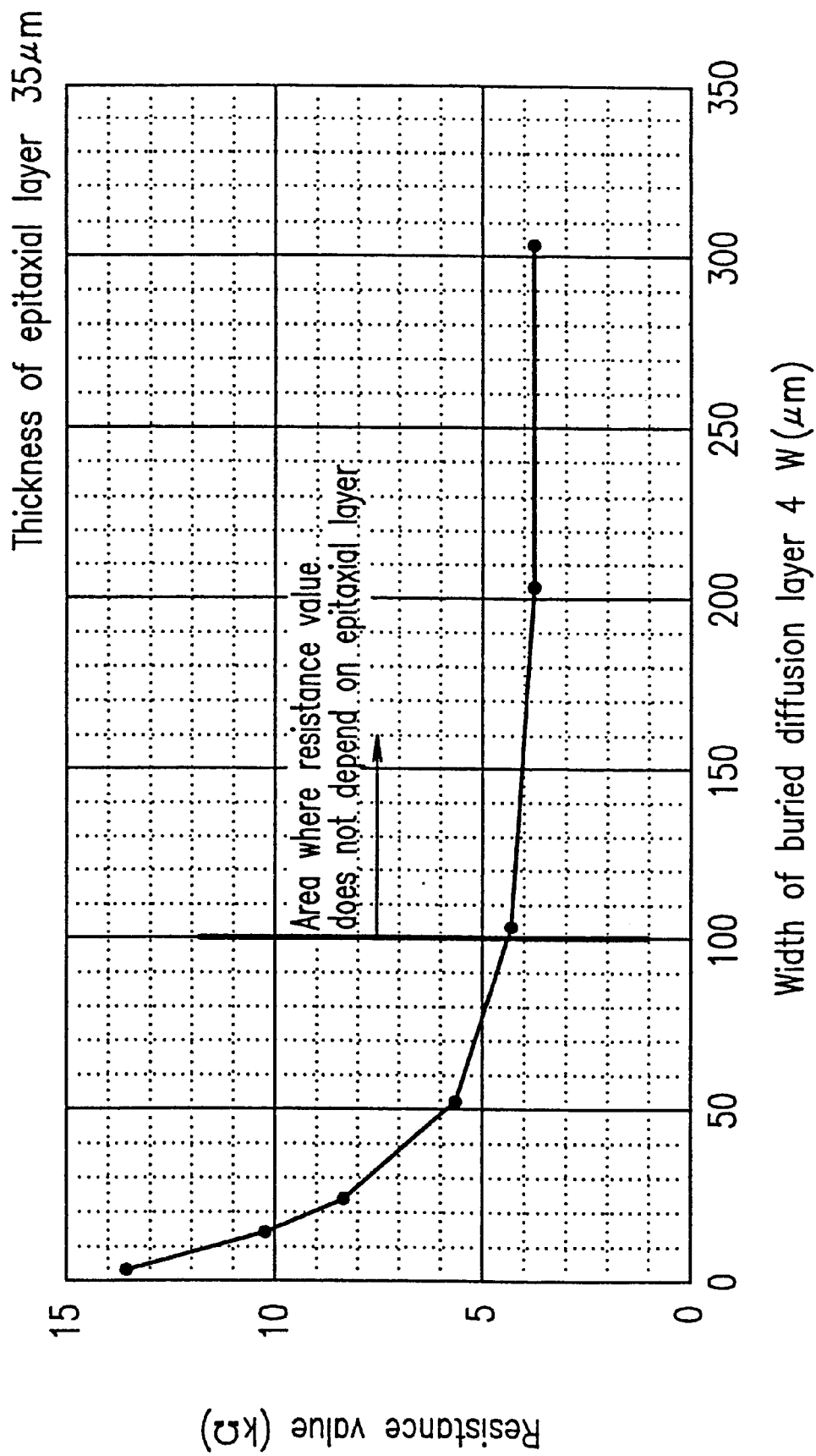
Figure 15:
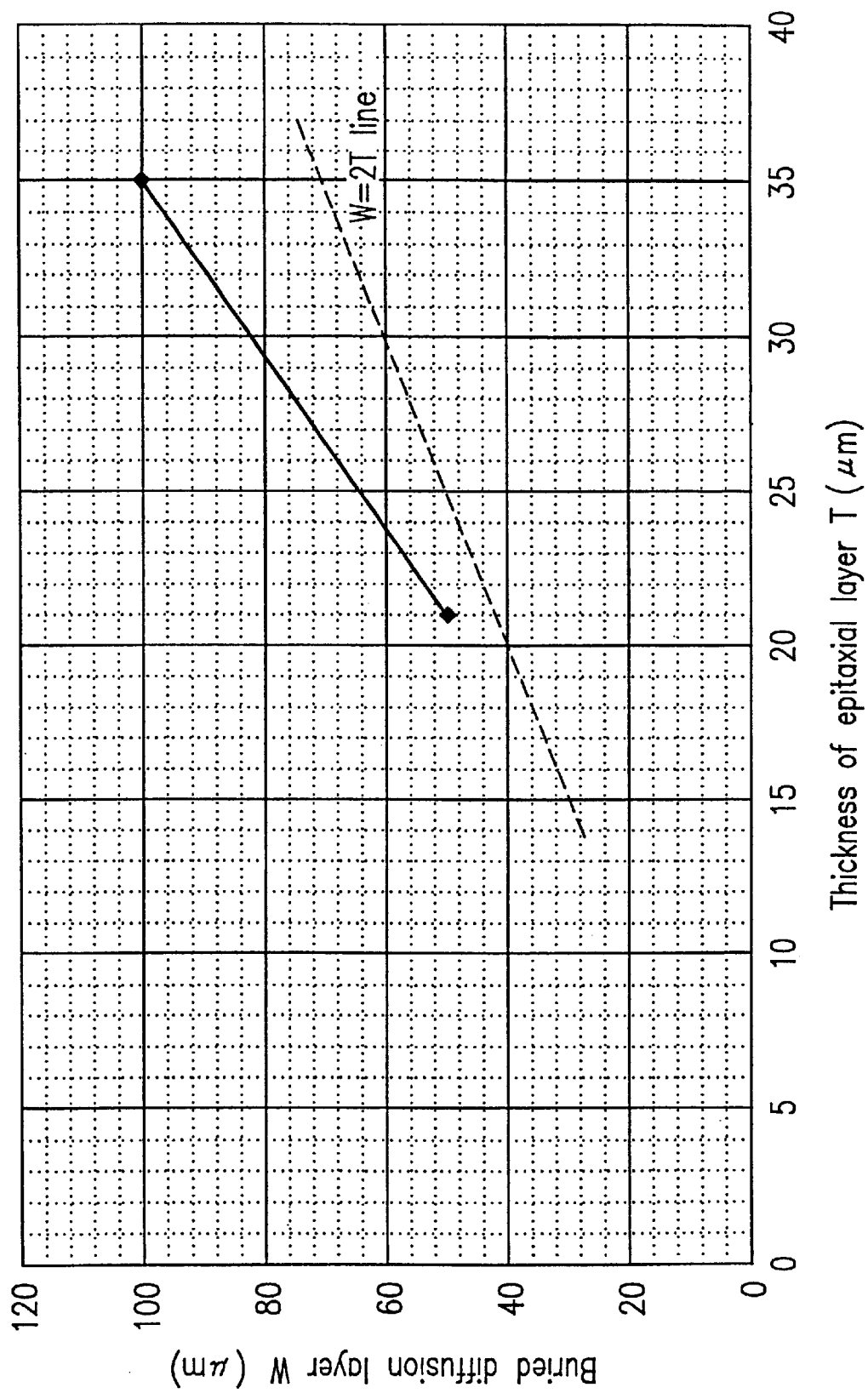
Figure 17A:
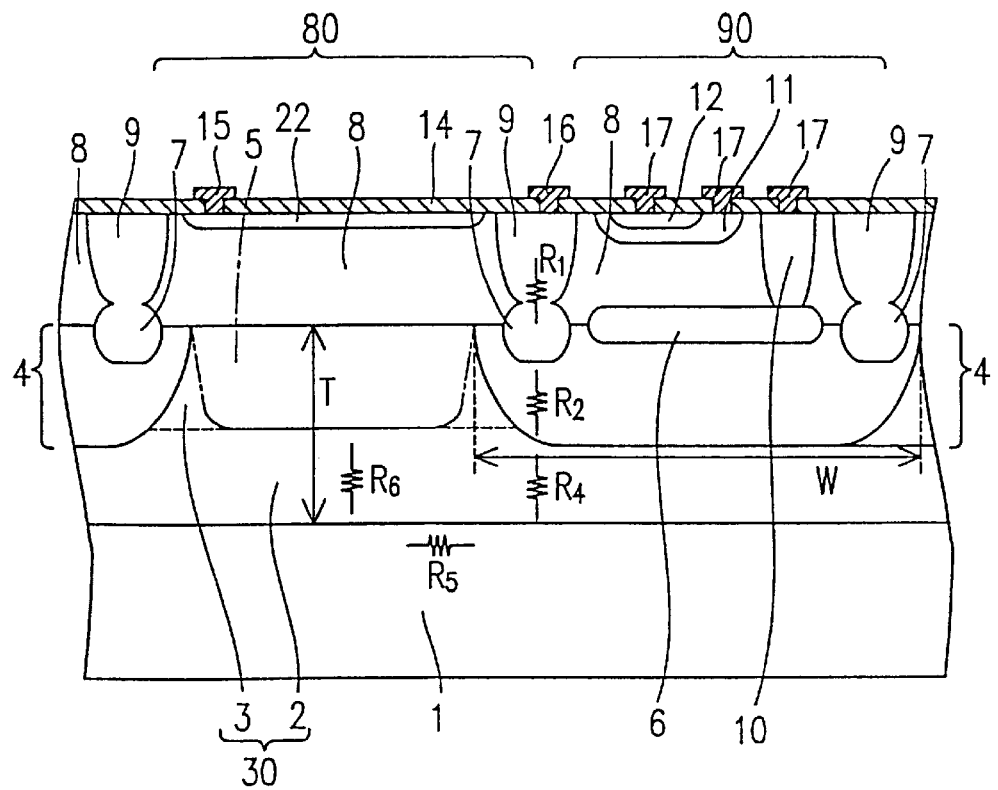
Figure 17B:
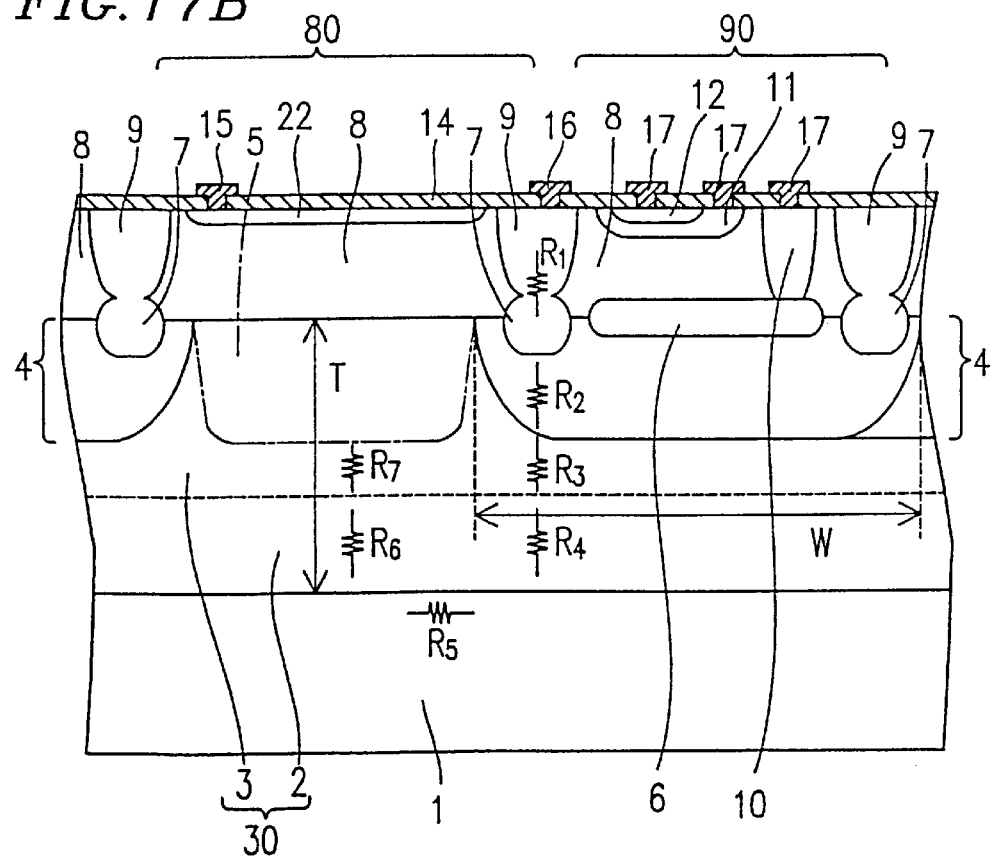
Figure 18:
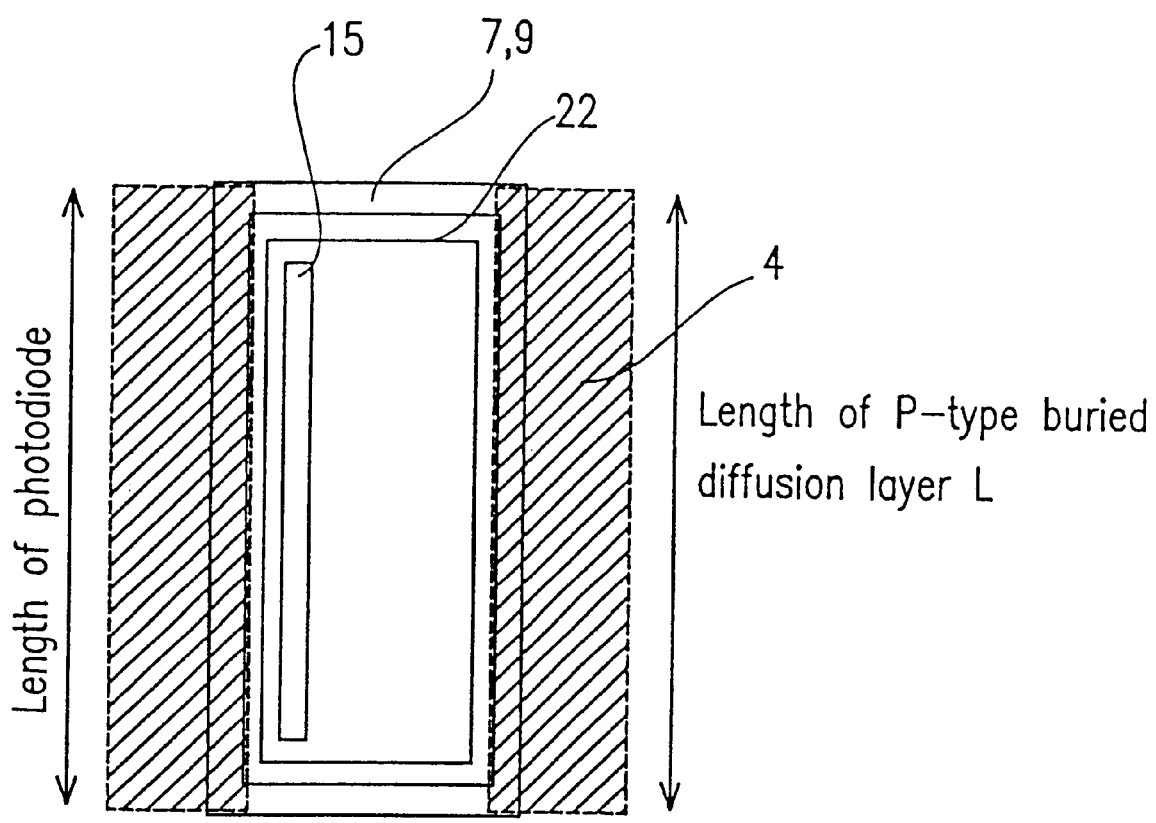
Figure 19:
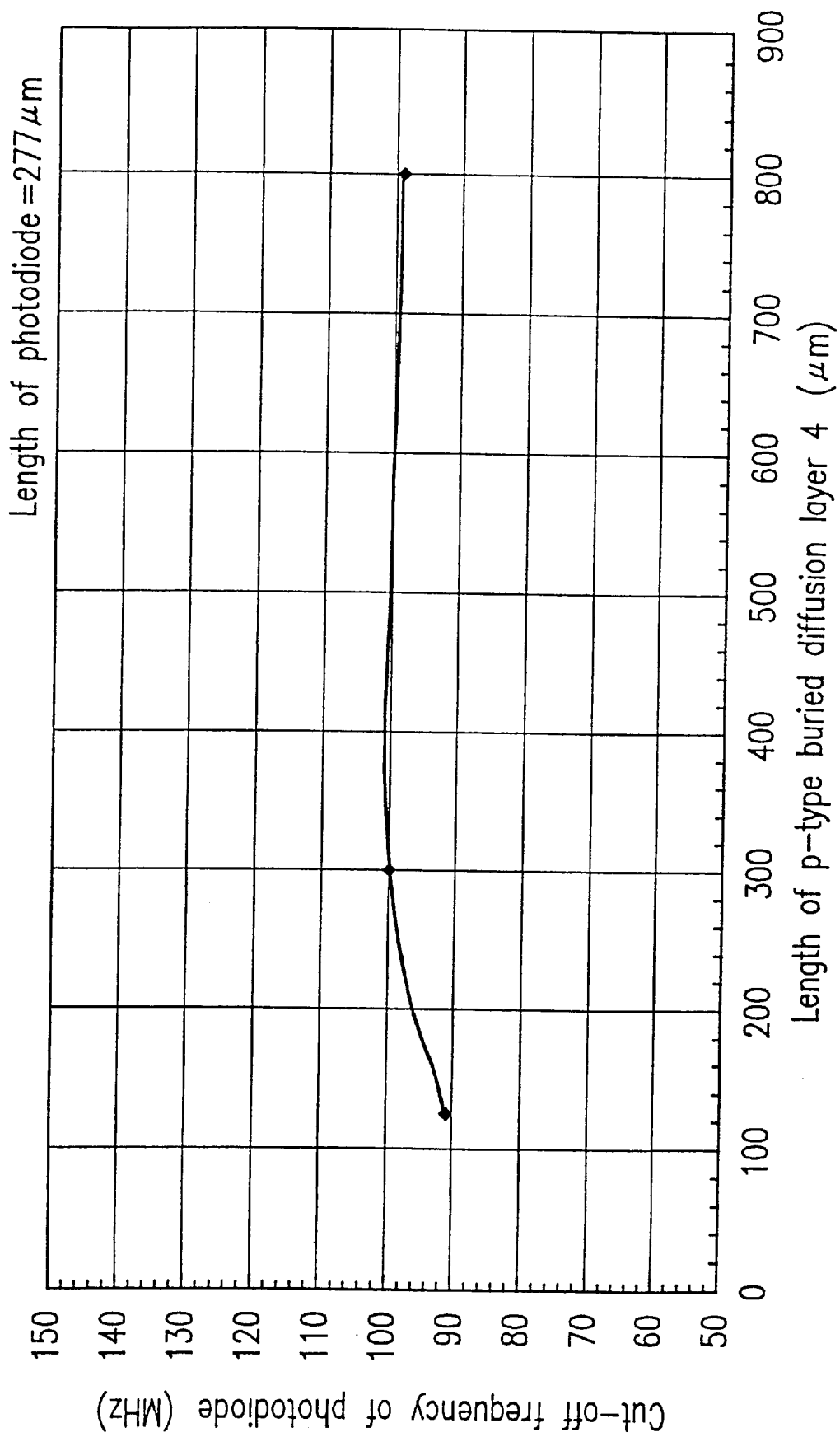
Figure 20:
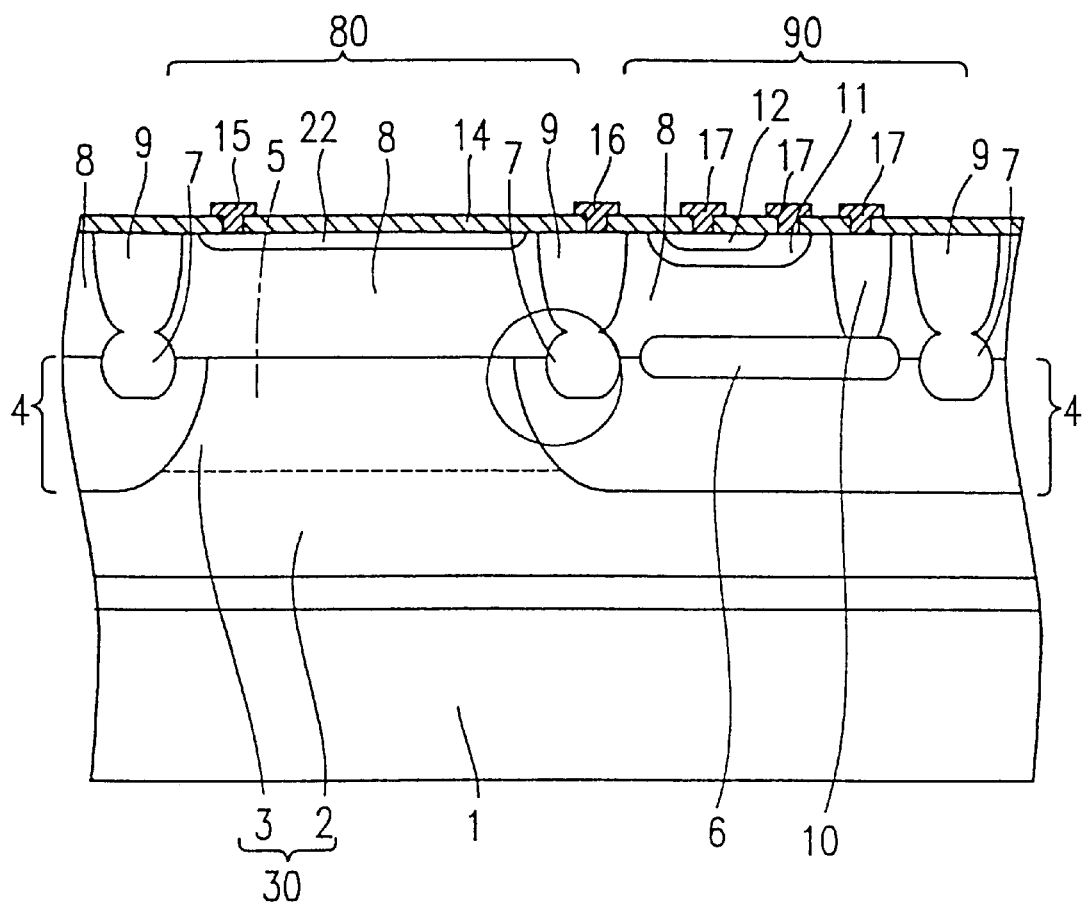
Figure 21:
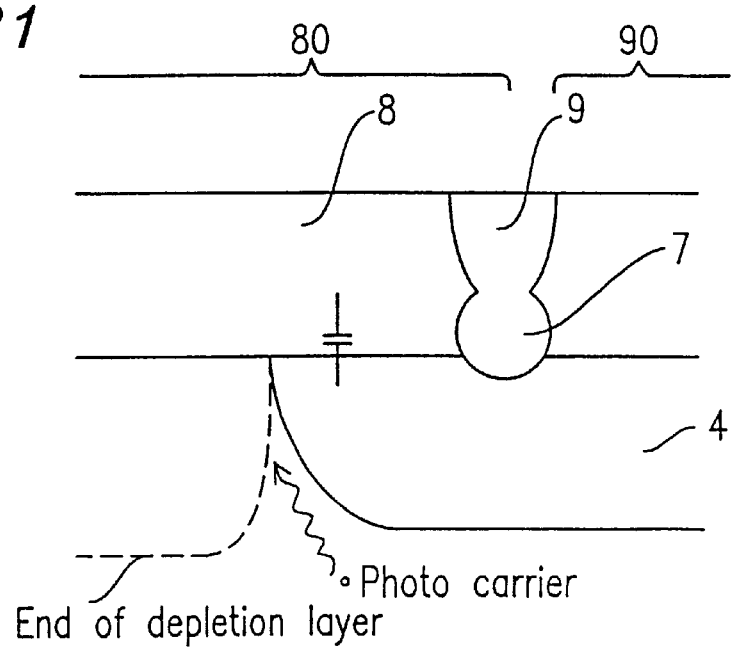
Figure 22:
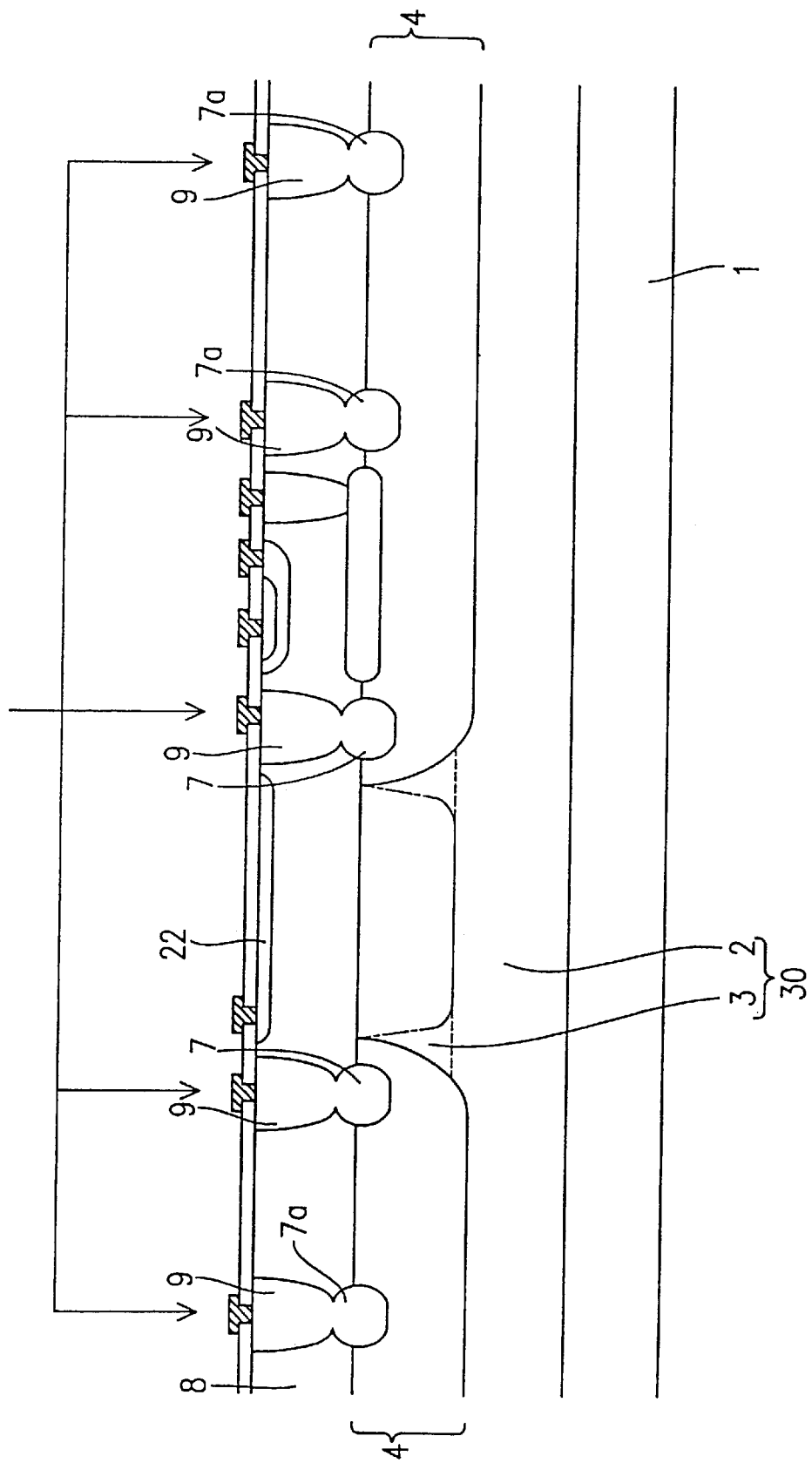
Figure 24A:
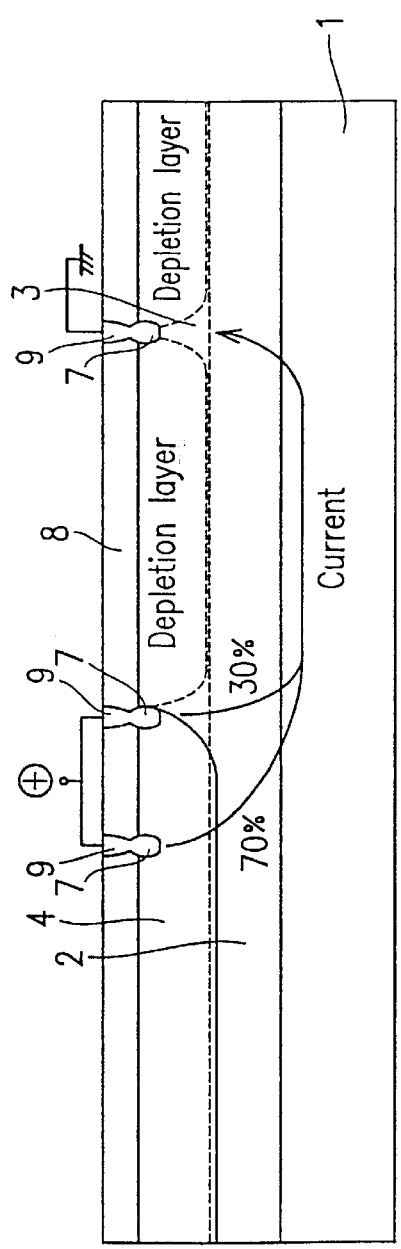
Figure 24B:
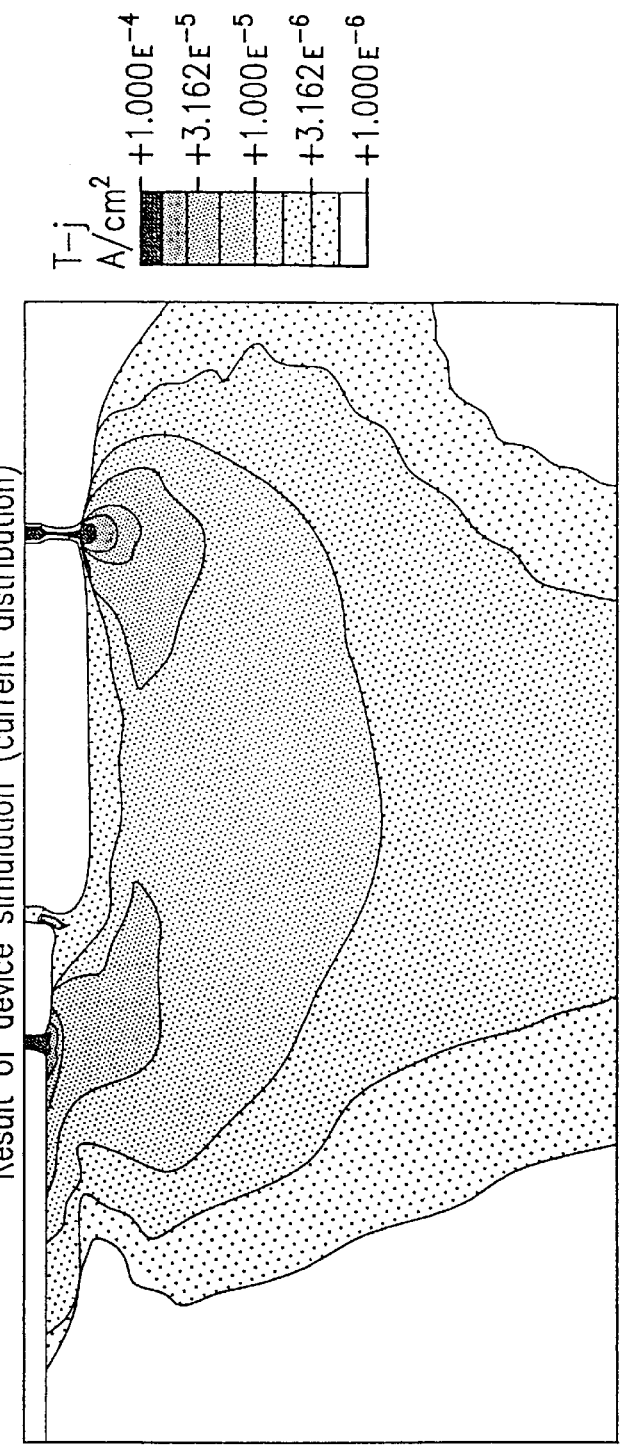
Figure 26:
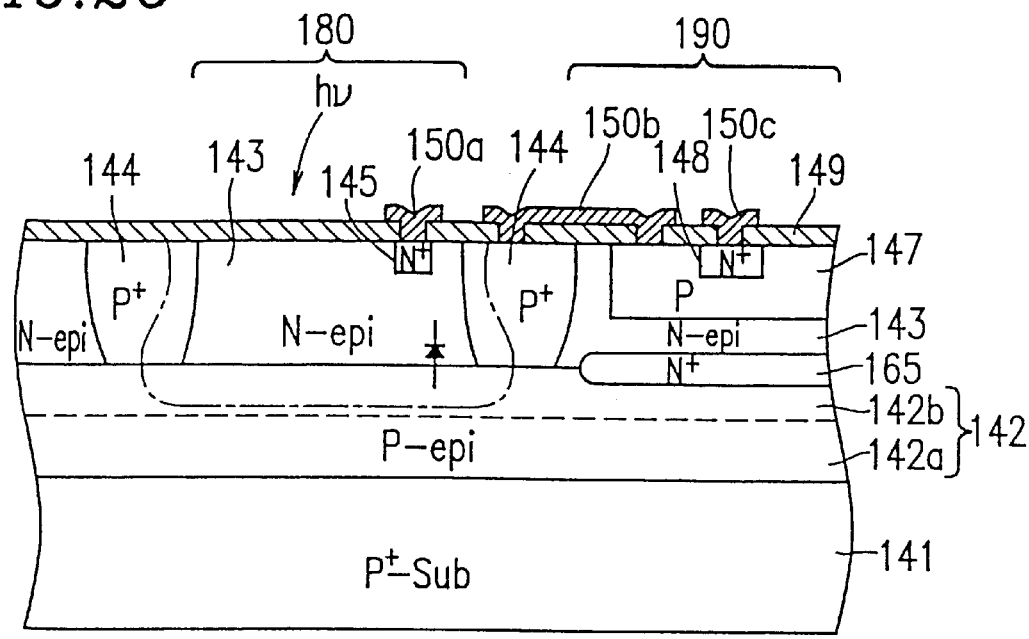
Figure 27:
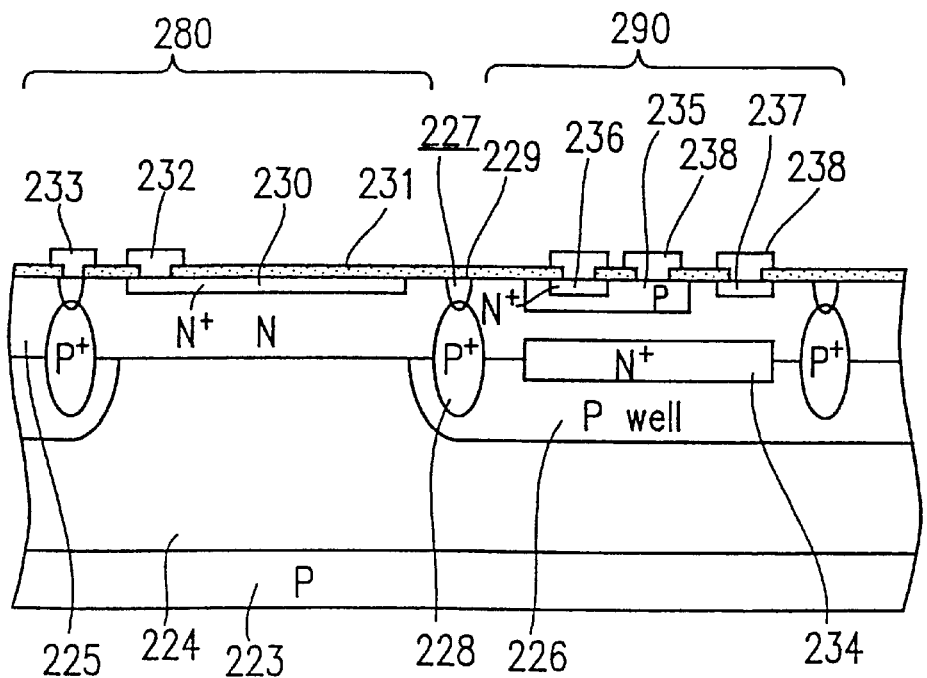
Figure 28:
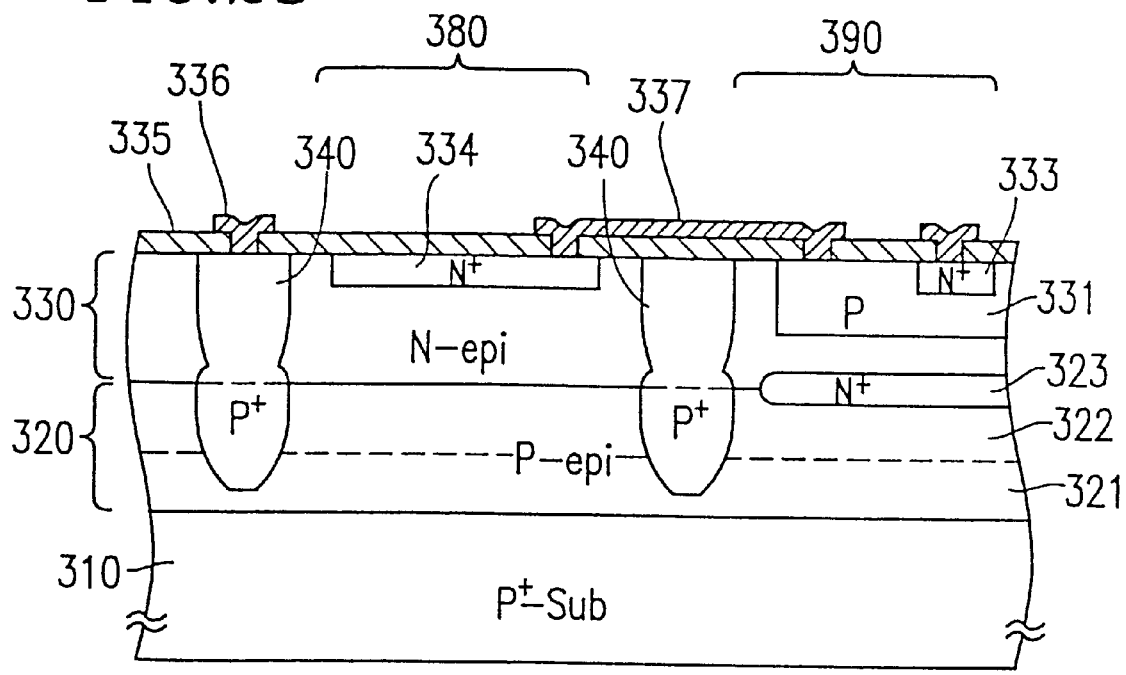
Figure 29A:
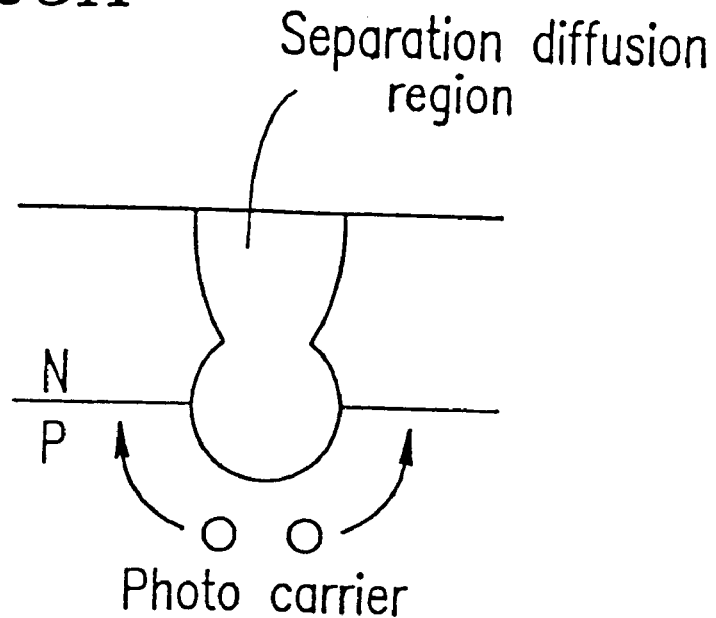
Figure 29B:
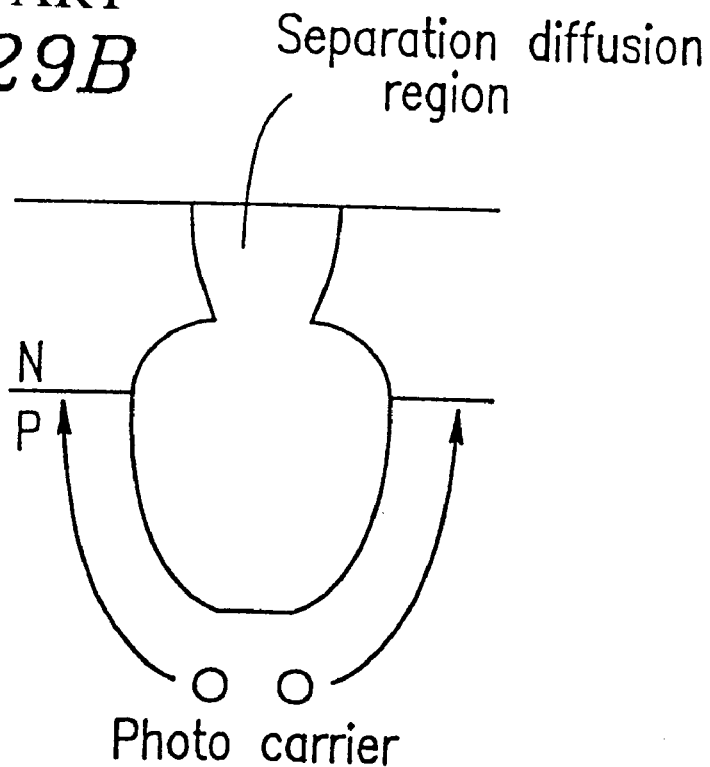
Figure 30A:
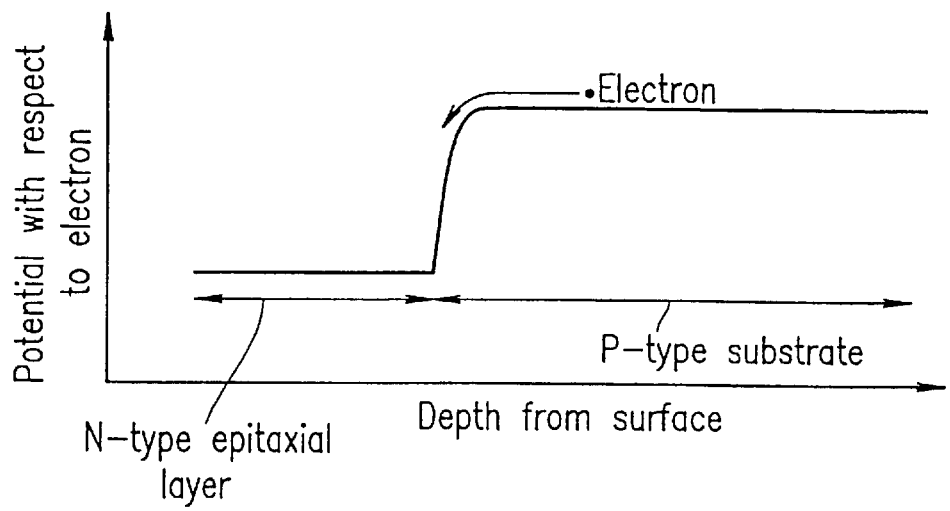
Figure 30B:
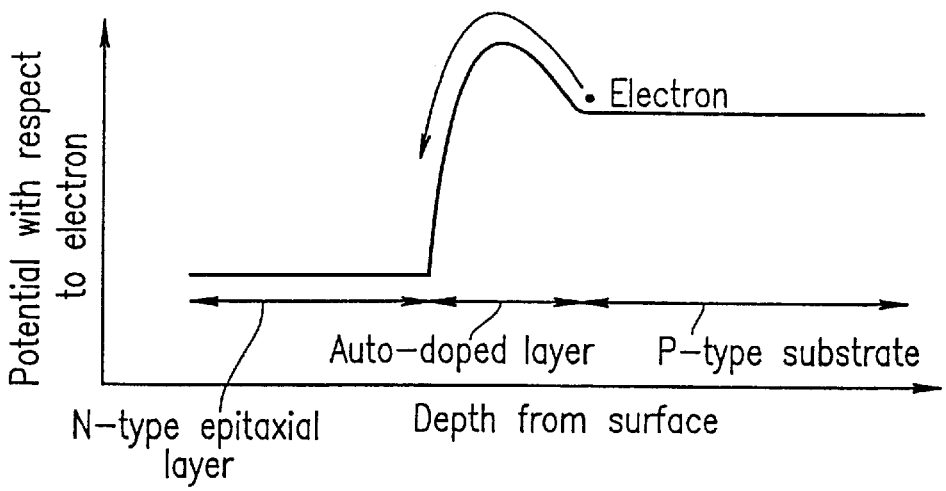

Each of FIGS. 2A and 2B is a diagram illustrating the relationship between a burled diffusion layer and a P-type high-specific-resistance epitaxial layer in the structure illustrated In FIG. 1 in terms of the change in impurity concentration;

FIG. 3 is a graph illustrating the relationship between a junction capacitance Cpd and a series resistance Rs of a photodiode which is required to realize a cut-off frequency fc=120 MHz, FIG. 4 shows the results of a two-dimensional simulation for the relationship between the impurity concentration at a boundary between a buried diffusion layer and an auto-doped layer and the series resistance Rs of the photodiode;

FIGS. 5A to 5F are cross-sectional views illustrating respective steps in a process for producing the circuit-integrated light-receiving device of FIG. 1;

FIGS. 6A and 6B are cross-sectional views illustrating how the circuit-integrated light-receiving device of the present invention can reduce the series resistance of the photodiode;

FIG. 7 is a cross-sectional view illustrating a structure of a circuit-integrated light-receiving device according to Embodiment 2 of the present invention;

FIG. 8 is a cross-sectional view illustrating a structure of a circuit-integrated light-receiving device according to Embodiment 3 of the present invention;

FIG. 9 is a cross-sectional view illustrating a structure of a circuit-integrated light-receiving device according to Embodiment 4 of the present invention;

FIG. 10 is a cross-sectional view illustrating a comparative structure used to show the effects provided by the circuit-integrated light-receiving device of FIG. 9 according to Embodiment 4 of the present invention;

FIG. 11 is a cross-sectional view illustrating a structure of a circuit-integrated light-receiving device according to Embodiment 5 of the present invention;

FIG. 12 is a graph illustrating the results of measurement of the series resistance of the photodiode for various thicknesses T of the epitaxial layer;

FIG. 13 is a graph illustrating the results of a device simulation of the change in the resistance value with respect to the width W of the buried diffusion layer where the epitaxial layer thickness T=21 $\mu$m;

FIG. 14 is a graph illustrating the results of a device simulation of the change in the resistance value with respect to the width W of the buried diffusion layer where the epitaxial layer thickness T=35 $\mu$m;

FIG. 15 is a graph illustrating the relationship between the thickness T of the epitaxial layer and the value of the width W of the buried diffusion layer at which the resistance value no longer depends on the width W;

FIGS. 16A to 16F are cross-sectional views illustrating respective steps in a process for producing the circuit-integrated light-receiving device according to Embodiment 5 of the present invention;

FIGS. 17A and 17B-are cross-sectional views illustrating how the circuit-integrated light-receiving device of the present invention can reduce the series resistance of the photodiode;

FIG. 18 is a cross-sectional view illustrating a structure of a circuit-integrated light-receiving device according to Embodiment 6 of the present invention;

FIG. 19 is a graph illustrating the relationship between the length of the buried diffusion layer and the response speed (cut-off frequency) of the photodiode;

FIG. 20 is a cross-sectional view illustrating a structure of a circuit-integrated light-receiving device according to Embodiment 7 of the present invention;

FIG. 21 is a cross-sectional view illustrating a problem occurring when a portion of the buried diffusion layer extending beyond the overlying buried separation diffusion layer toward the light-receiving device section is irradiated with light;

FIG. 22 is a cross-sectional view illustrating a structure of a circuit-integrated light-receiving device according to Embodiment 8 of the present invention;

FIG. 23 illustrates how the response speed of a photodiode can be improved by the circuit-integrated light-receiving device according to Embodiment 8 of the present invention;

Each of FIGS. 24A and 24B illustrates the results of a device simulation for the current flow in the circuit-integrated light-receiving device according to Embodiment 8, wherein FIG. 24A is a cross-sectional view illustrating the current flow, and FIG. 24B illustrates a current distribution;

FIG. 25 is a cross-sectional view illustrating a structure of a circuit-integrated light-receiving is device according to Embodiment 9 of the present invention;

FIG. 26 is a cross-sectional view illustrating a structure of a conventional circuit-integrated light-receiving device;

FIG. 27 is a cross-sectional view illustrating a structure of another conventional circuit-integrated light-receiving device;

FIG. 28 is a cross-sectional view illustrating a structure of still another conventional circuit-integrated light-receiving device;

FIGS. 29A and 29B illustrate a problem associated with the formation of a deep separation diffusion region; and FIGS. 30A and 30B illustrate a problem associated with the formation of an auto-doped layer in the vicinity of a PN junction of a photodiode.

DESCRIPTION OF THE PREFERRED EMBODIMENTS

Before describing the particular embodiments of the present invention, the observations that have been made by the present inventors to achieve the present invention will be described.

The conventional structure described above with reference to FIG. 28 employs the substrate 310 having a relatively high impurity concentration (e.g., about $1 \times 10^{19}$ atoms/cm$^3$). Thus, when forming the N-type epitaxial layer 330, the impurity is auto-doped by diffusing the impurity of the substrate 310 in vapor phase into the surface portion (the boundary between the N-type epitaxial layer 330 and the P-type epitaxial layer 320) of the P-type epitaxial layer 320 which is provided on the substrate 310. The impurity concentration of the resulting auto-doped layer is typically about $10^{-3}$ of that of the substrate 310. In the example illustrated in FIG. 28, the impurity concentration of the substrate 310 is about $1 \times 10^{19}$ atoms/cm$^3$, whereby an auto-doped layer having an impurity concentration of about $1 \times 10^{16}$ atoms/cm$^3$ will be formed on the surface of the P-type epitaxial layer 320. The impurity concentration in the vicinity of the PN junction of the P-type epitaxial layer 320 which forms the photodiode is preferably about $1 \times 10^{13}$ atoms/cm$^3$ to about $1 \times 10^{14}$ atoms/cm$^3$ in order to reduce the junction capacitance. However, if an auto-doped layer having such a high impurity concentration exists in the vicinity of the PN junction, the extension of the depletion layer is restricted, thereby increasing the junction capacitance and thus lowering the response speed of the photodiode.

Moreover, as schematically illustrated in FIGS. 30A and 30B, the auto-doped layer formed in the vicinity of the PN junction has a substantial influence on the movement of a carrier (electron) generated in the P-type substrate.

In particular, if no auto-doped layer exists on the surface of the P-type substrate (herein, it is assumed that the P-type substrate also includes the P-type epitaxial layer formed on the substrate), i.e., in the vicinity of the PN junction, a carrier (electron) generated in the P-type substrate can move into the N-type epitaxial layer without having to overcome a barrier, as illustrated in FIG. 30A. However, if an auto-doped layer exists on the surface of the P-type substrate (in the vicinity of the PN junction), as illustrated in FIG. 5B, the auto-doped layer acts as a potential barrier for an electron, thereby restricting the movement of the electron from inside the P-type substrate to the N-type epitaxial layer, as illustrated in FIG. 30B, thereby lowering the response speed of the photodiode.

Thus, according to the observations made by the present inventors, the conventional structure illustrated in FIG. 28 suffers from a reduction in the photodiode response speed which is associated with the increase in the size of the separation diffusion region 340 in the depth direction and in the width (lateral) direction while also suffering from another reduction in the photodiode response speed which is associated with the high impurity concentration of the substrate 310 (and, more particularly, the resulting formation of the auto-doped layer in the vicinity of the PN junction).

Further observations of the structure illustrated in FIG. 28 show that the impurity concentration is set to about $1 \times 10^{16}$ atoms/cm$^3$ in the vicinity of the contact point between the separation diffusion region 340 and the auto-doped layer 321 for the purpose of reducing the series resistance of the photodiode. The present inventors have actually produced a device having the structure as illustrated in FIG. 28, and measured the series resistance of the photodiode. The measurement of the series resistance of the photodiode having the above-described characteristics was about 35 Ω.

Further observations by the present inventors confirmed that it is not necessary to reduce the series resistance of the photodiode to be as low as 35 Ω.

In particular, for a light-receiving device to be used in a 12×-speed DVD-ROM apparatus, for example, the photodiode included in the light-receiving device is required to have a response speed represented by a range of 120 MHz or more of the cut-off frequency fc. Assuming that the light receiving area of the photodiode, which is determined by the optical system parameters such as the laser beam diameter, is 60 μm×240 μm, for example, the junction capacitance Cpd of the photodiode will be about 0.6 pF. Using these values, Expression (1) below was calculated for the value of the series resistance Rs of the photodiode, confirming that the value Rs of about 2.2 kΩ or less is sufficient.

$$fc=1/(2\pi \cdot Cpd \cdot Rs) \quad (1)$$

The present invention has been achieved based on the above-described observations made by the present inventors. Various embodiments of the present invention will now be described with reference to the accompanying drawings.

EMBODIMENT 1

FIG. 1 is a cross-sectional view illustrating a structure of a circuit-integrated light-receiving device according to Embodiment 1 of the present invention.

The circuit-integrated light-receiving device illustrated in FIG. 1 includes a photodiode section 80 and a signal processing circuit section 90 which are provided adjacent to each other. It is noted that elements which are provided after the metal wiring process, e.g., a multilayer line and a protection film, are not shown in FIG. 1.

In this structure, a P-type high-specific-resistance epitaxial layer 30 is provided on the surface of a P-type semiconductor substrate 1. The P-type high-specific-resistance epitaxial layer 30 includes a first portion 2 (also referred to as the "auto-doped layer 2") and a second portion 3 (also referred to as the "uniform concentration layer 3"). The first portion 2 has an impurity concentration which gradually decreases in the direction along the thickness thereof away from the interface between the P-type high-specific-resistance epitaxial layer 30 and the substrate 1 as a result of the auto-doping of the impurity from the substrate 1. The second portion 3 is located above the first portion 2 and has an impurity concentration which is uniform along the depth direction.

An N-type epitaxial layer 8 is provided on the P-type high-specific-resistance epitaxial layer 30. A separation diffusion region including two diffusion regions 7 and 9 is provided extending through the N-type epitaxial layer 8. The separation diffusion region extends to a predetermined depth from the surface of the N-type epitaxial layer 8. The separation diffusion region divides the N-type epitaxial layer 8 into a number of regions.

Some of the separated regions of the N-type epitaxial layer 8 each form the light-receiving device section 80. In particular, the light-receiving device section 80 includes a PN junction formed between one of the separated regions of the N-type epitaxial layer 8 and the underlying P-type epitaxial layer 30. An N-type diffusion layer 22 is provided in the light-receiving device section (photodiode section) 80 in the vicinity of the surface of the N-type epitaxial layer 8 in order to reduce the cathode resistance.

The signal processing circuit section 90 is provided in a portion of the N-type epitaxial layer 8 adjacent to the photodiode section 80. In the illustrated example, the signal processing circuit section (NPN transistor) 90 includes a buried region 6 for reducing the collector resistance, an N-type compensation diffusion layer 10, a base diffusion region 11 and an emitter diffusion region 12.

The photodiode section 80 and the signal processing circuit section 90 are electrically separated from each other by the above-described separation diffusion regions 7 and 9.

An insulator layer 14 made of a material such as a silicon oxide is provided on the upper surface of the structure. A cathode electrode 15 is provided over the N-type diffusion layer 22 and is connected thereto via a contact hole. An anode electrode 16 is connected to the separation diffusion regions 7 and 9. Moreover, predetermined electrode and line elements 17 are electrically connected to the signal processing circuit section (NPN transistor) 90 similarly via contact holes.

In the structure illustrated in FIG. 1, the impurity concentration of the P-type semiconductor substrate 1 is set so as not to exceed $10^3$ of that on the surface of the P-type high-specific-resistance epitaxial layer 30 so that an auto-doped layer will not be formed in a subsequence process on the surface of the P-type high-specific-resistance epitaxial layer 30, which is provided on the surface of the substrate 1. In particular, when forming the P-type high-specific-resistance epitaxial layer 30 having a high specific resistance of, for example, about 1 kΩcm, the impurity concentration of the P-type semiconductor substrate 1 is set to about $1 \times 10^{16}$ atoms/cm$^3$ (1 Ωcm). This is because the impurity concentration of the auto-doped layer formed on the surface of the P-type high-specific-resistance epitaxial layer 30 and that of the P-type semiconductor substrate 1 have the relationship of about $1:10^3$. Thus, if the impurity concentration of the P-type semiconductor substrate 1 is set so as not to exceed $10^3$ of the set Value of the impurity concentration on the surface of the P-type high-specific-resistance epitaxial layer 30, the resulting impurity concentration on the surface of the P-type high-specific-resistance epitaxial layer 30 will not exceed the predetermined set value even when the impurity auto-doping occurs.

A buried diffusion layer 4 is further provided in a predetermined location in the P-type high-specific-resistance-epitaxial layer 30. In particular, the buried diffusion layer 4 is provided so as to contact the auto-doped layer 2 of the P-type high-specific-resistance epitaxial layer 30 in the signal processing circuit section 90. As a result, the uniform concentration layer 3 of the P-type high-specific-resistance epitaxial layer 30 does not exist in the signal processing circuit section 90.

Each of FIGS. 2A and 2B is a diagram illustrating the relationship between the buried diffusion layer 4 and the P-type high-specific-resistance epitaxial layer 30 (2 and 3) in terms of the change in impurity concentration.

As illustrated in FIG. 2A, the buried diffusion layer 4 and the auto-doped layer 2 contact each other directly under the separation diffusion region 7. The heat treatment conditions are controlled so as to set the depth of the buried diffusion layer 4 and the thickness of the auto-doped layer 2 so that the impurity concentration at the boundary between the two layers 4 and 2 is about $1 \times 10^{13}$ atoms/cm$^3$ or more. However, when the heat treatment conditions have to be determined based on other diffusion conditions, the thickness of the uniform concentration layer 3 of the P-type high-specific-resistance epitaxial layer 30 is adjusted so that the impurity concentration at the boundary between the two layers 4 and 2 is about $1 \times 10^{13}$ atoms/cm$^3$ or more.

Referring back to FIG. 1, the buried diffusion layer 4 extends beyond the separation diffusion regions 7 and 9 into the end portion of the photodiode section 80. However, as illustrated in FIG. 2B, in the vicinity of the end portion of the photodiode section 80, the buried diffusion layer 4 and the auto-doped layer 2 do not directly contact each other, but only via the uniform concentration layer 3 of the P-type high-specific-resistance epitaxial layer 30.

Since the buried diffusion layer 4 is formed by a diffusion from the surface of the P-type high-specific-resistance epitaxial layer 30, the buried diffusion layer 4 has a concentration profile such that the impurity concentration decreases in the depth direction, as illustrated in FIG. 2A. The above impurity concentration of about $1 \times 10^{13}$ atoms/cm$^3$ at the boundary between the buried diffusion layer 4 and the auto-doped layer 2 is a value which has been determined so that the cut-off frequency fc is 120 MHz which is required for a 12x-speed DVD-ROM apparatus, for example. This will be further discussed. Assuming that the light receiving area of the photodiode is 60 $\mu$m×120 $\mu$m, for example, the junction capacitance Cpd of the photodiode will be about 0.6 pF. Based on Expression (1) above, the cut-off frequency fc=120 MHz. FIG. 3 is a graph illustrating the relationship between the junction capacitance Cpd and the series resistance Rs of the photodiode which is required to realize the cut-off frequency fc=120 MHz. Based on the graph of FIG. 3, the series resistance Rs. of the photodiode can be set to about 2.2 k$\Omega$ or less. FIG. 4 shows the results of a two-dimensional simulation for the relationship between the impurity concentration at the boundary between the buried diffusion layer 4 and the auto-doped layer 2 and the series resistance Rs of the photodiode. The simulation results show that Rs of about 2.2 k$\Omega$ or less can be obtained by setting the impurity concentration at the boundary between the two layers 2 and 4 to about $1 \times 10^{13}$ atoms/cm$^3$ or more.

The P-type high-specific-resistance epitaxial layer 30 is formed while adjusting the specific resistance and the thickness thereof so that a depletion layer 5 is extended by the bias voltage applied across the photodiode section 80 to reach the auto-doped layer 2. For example, when the specific resistance of the P-type high-specific-resistance epitaxial layer 30 (in particular, the uniform concentration layer 3 thereof) is about 1 k$\Omega$cm, for example, the impurity concentration thereof is about $1 \times 10^{13}$ atoms/cm$^3$ because the conductivity type thereof is P. When the bias voltage is 1.5 V, the depletion layer 5 formed under such an impurity concentration condition extends by a distance of about 14.5 $\mu$m from the lower surface of the N-type epitaxial layer 8 into the P-type high-specific-resistance epitaxial layer 30. The thickness of the auto-doped layer 2 which is formed by a heat treatment upwardly from the upper surface of the substrate 1 is about 16 $\mu$m. Based on these results, the thickness of the P-type high-specific-resistance epitaxial layer 30 can be set to about 30.5 $\mu$m.

Next, a method for producing a light-receiving device according to the present embodiment having such a structure will be described with reference to FIGS. 5A to 5F.

Figure 5A:
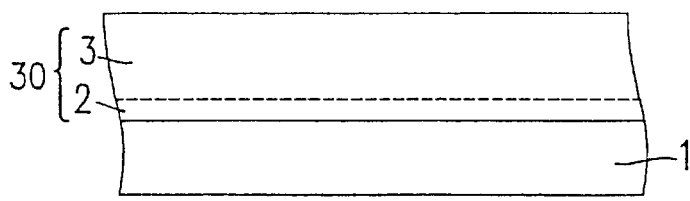
Figure 5B:
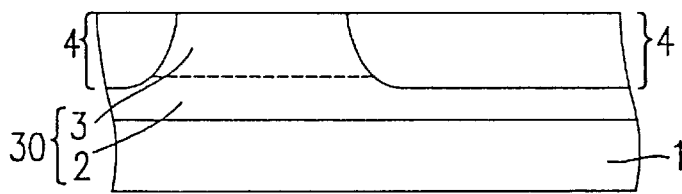

First, referring to FIG. 5A, the P-type high-specific-resistance epitaxial layer 30 is formed on the P-type semiconductor substrate 1. At this point, the auto-doped layer 2 having a certain thickness is already formed in a lower portion of the P-type high-specific-resistance epitaxial layer 30. The impurity concentration of the auto-doped layer 2 gradually decreases in the direction away from the upper surface of the substrate 1. The rest of the P-type high-specific-resistance epitaxial layer 30 is the uniform concentration layer 3 having a constant impurity concentration.

Then, referring to FIG. 5B, the P-type buried diffusion layer 4 is formed in a predetermined region of the P-type high-specific-resistance epitaxial layer 30 (mainly where the signal processing circuit will later be formed). After the heat treatment is performed to form the P-type buried diffusion layer 4, the thickness of the auto-doped layer 2 increases from that illustrated in FIG. 5A. As described above, the P-type buried diffusion layer 4 is formed so as to directly contact the auto-doped layer 2.

Figure 5C:
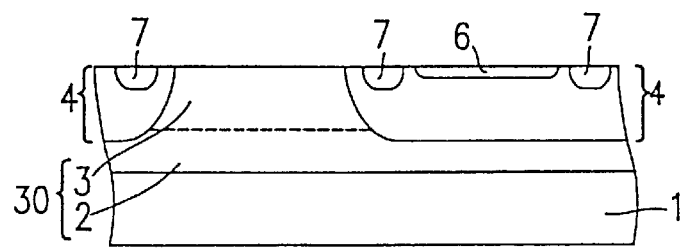

Then, referring to FIG. 5C, the separation diffusion region 7 and the buried region 6 are formed near the upper surface of the P-type buried diffusion layer 4.

Figure 5D:
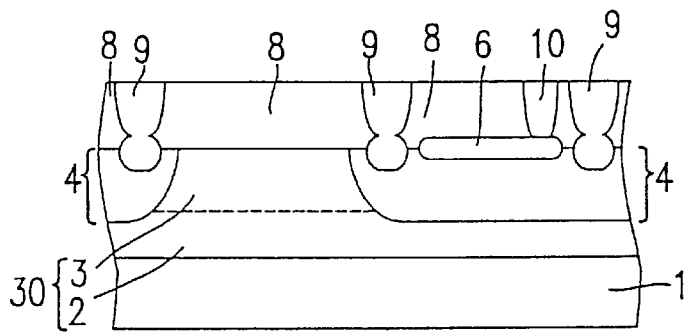

Then, referring to FIG. 5D, the N-type epitaxial layer 8 is formed on the P-type buried diffusion layer 4 and the P-type high-specific-resistance epitaxial layer 30. The separation diffusion region 9 is formed to downwardly extend from the upper surface of the N-type epitaxial layer 8 to join the separation diffusion region 7. The N-type compensation diffusion layer 10 is further formed in the N-type epitaxial layer 8 in the signal processing circuit section.

Figure 5E:
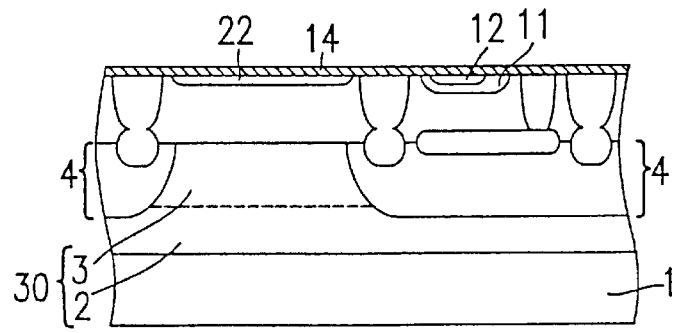

Then, referring to FIG. 5E, a P-type impurity is diffused into the surface portion of the N-type epitaxial layer 8 in the signal processing circuit section so as not to overlap the N-type compensation diffusion layer 10, thereby forming the base diffusion region 11. Then, an N-type impurity is diffused into the base diffusion region 11 to form the emitter diffusion region 12. Simultaneously with the formation of the emitter diffusion region 12, the N-type diffusion layer 22 for reducing the series resistance on the cathode side of the light-receiving device (photodiode) to be produced is formed in the surface portion of the N-type epitaxial layer 8 in the light-receiving device section. Moreover, the insulator layer 14 of oxide silicon, or the like, is formed to cover the supper surface of the N-type epitaxial layer 8 having the various regions formed therein.

Figure 5F:
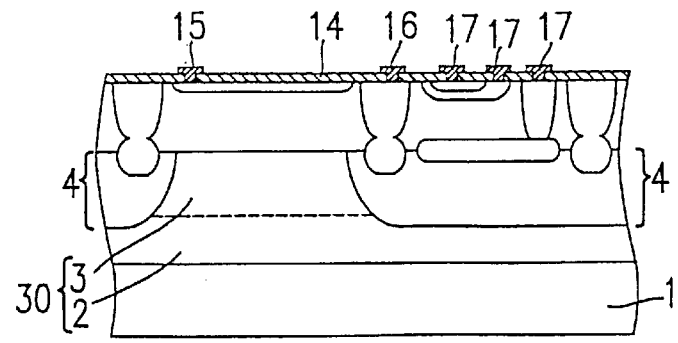

Then, referring to FIG. 5F, contact holes are provided in predetermined locations of the insulator layer 14. Then, the cathode electrode 15 and the anode electrode 16 of aluminum, or the like, are formed to be connected to the N-type diffusion layer 22 of the light-receiving device (photodiode) and to the separation diffusion region 9, respectively. For the signal processing circuit section, the electrode and line elements 17 of aluminum, or the like, are formed to be connected to the respective diffusion regions of the produced device (NPN transistor).

Thereafter, further processes commonly employed in the art of semiconductor technology, including a multilayer line formation step and a protection film formation step (these steps will not further be described herein), are performed, thereby producing a circuit-integrated light-receiving device in which a signal processing circuit (NPN transistor) and a photodiode are integrally formed adjacent to each other.

Referring to FIGS. 6A and 6B, how the series resistance of the photodiode of the present invention is reduced will be described.

FIG. 6A shows the structure of the light-receiving device of the present embodiment of FIG. 1 with the respective resistance components of the series resistance of the photodiode (as described in the prior art section) being superimposed thereon. As can be seen from FIG. 6A, in the structure of the present embodiment, the series resistance of the photodiode includes the following components R1–R6:

R1: The resistance of the separation diffusion regions 7 and 9

R2: The resistance of the buried diffusion layer 4

R4: The resistance of the auto-doped layer 2 underlying the separation diffusion regions R5: The resistance of the substrate 1

R6: The resistance of the auto-doped layer 2 underlying the photodiode section 80

Because the buried diffusion layer 4 is in contact with the auto-doped layer 2 and the depletion layer 5 in the photodiode section 80 is contact with the auto-doped layer 2, the resistance components R3 and R7 as described in the prior art section no longer exist in the structure of the present invention. Moreover, because the separation diffusion regions 7 and 9 have a high impurity concentration, the resistance R1 thereof is low. Each of the substrate resistance R5 and the resistance components R2, R4 and R6 created due to the auto-doped layer 2 and the buried diffusion layer 4 has a value which does not substantially contribute to the series resistance of the photodiode.

Thus, the present invention realizes the structure in which the series resistance of the photodiode is sufficiently reduced. Moreover, because the impurity concentration of the substrate 1 is low, an auto-doped layer will not be formed in the vicinity of the upper surface of the P-type high-specific-resistance epitaxial layer 30 (i.e., the PN junction between the layer 30 and the N-type epitaxial layer 8), and thus the impurity concentration therein will not be high. Thus, the junction capacitance is prevented from increasing.

FIG. 6B illustrates a comparative structure where the structure of Embodiment 1 of the present invention as illustrated in FIG. 1 is modified according to a typical conventional structure (where the auto-doped layer 2 of the P-type high-specific-resistance epitaxial layer 30 is not in contact with the depletion layer 5 or the buried diffusion layer 4), with the respective resistance components of the series resistance of the photodiode being superimposed thereon. For the purpose of comparison, like elements as those in the structure of the present invention are denoted by like reference numerals.

As can be seen from the foregoing discussion, it is not possible with such a comparative structure to sufficiently reduce the series resistance without increasing the junction capacitance at the PN junction or lowering the response speed of the photodiode.

EMBODIMENT 2

FIG. 7 is a cross-sectional view illustrating a structure of a circuit-integrated light-receiving device according to Embodiment 2 of the present invention.

It is noted that elements which are provided after the metal wiring process, e.g., a multilayer line and a protection film, are not shown in FIG. 7. Moreover, elements in FIG. 7 having like reference numerals to those shown in FIG. 1 will not further be described, and only those that are different from the structure of FIG. 1 will be described below.

It is preferred to suppress the impurity concentration of the P-type semiconductor substrate in order to reduce the amount of impurity auto-doped from the P-type semiconductor substrate. In terms of the specific resistance, the substrate 1 preferably has a specific resistance of about 1 Ωcm or more, and more preferably about 100 Ωcm or more. In order to further increase the response speed of the photodiode, it is necessary to reduce the value of the substrate resistance R5 shown in FIG. 6A. In other words, the specific resistance of the substrate needs to be reduced in order to further increase the response speed of the photodiode. However, simply reducing the specific resistance of the substrate will cause a problem of auto-doping.

In view of the above, the present embodiment forms a P-type high-concentration impurity layer 13 having a relatively high impurity concentration on the surface of the P-type substrate 1. In particular, an impurity such as boron is introduced by ion injection, or the like, into the surface portion of the substrate 1 so as to form with good precision the P-type high-concentration impurity layer 13 having an impurity concentration of about $1 \times 10^{19}$ atoms/cm$^3$, for example. Thereafter, as in Embodiment 1, the P-type epitaxial layer 6, the N-type epitaxial layer 8, and the like, are sequentially deposited on the P-type high-concentration impurity layer 13, and then the predetermined diffusion regions are further formed, thereby producing the circuit-integrated light-receiving device. Elements other than the P-type impurity layer 13 and the production process are substantially the same as those described in Embodiment 1, and thus will not further be described below.

By forming the P-type high-concentration impurity layer 13 as described above, the substrate resistance R5 shown in FIG. 6A can be reduced.

The P-type high-concentration impurity layer 13 of the present embodiment is capped by the P-type high-specific-resistance epitaxial layer 30. Therefore, even when a heat treatment is subsequently performed to form the N-type epitaxial layer 8, there will be no or a negligible level of auto-doping due to the P-type high-concentration impurity layer 13.

Even if the impurity concentration of the P-type high-concentration impurity layer 13 set to, for example, about $1 \times 10^{16}$ atoms/cm$^3$ or more, because the impurity layer is capped by the P-type high-specific-resistance epitaxial layer deposited thereon, an auto-doped layer will not be formed on the surface of the P-type high-specific-resistance epitaxial layer as in the case where the impurity concentration of the substrate is increased. In order to reduce the series resistance of the photodiode, it is preferred to set the impurity concentration of the impurity layer to a high value, e.g., about $1\times10^{19}$ atoms/cm$^3$ or less, within a range for which the device can normally be produced.

As described above, if the P-type high-concentration impurity layer 13 is formed between the substrate 1 and the P-type high-specific-resistance epitaxial layer 30 by introducing a P-type impurity such as boron at a high concentration, it is possible to reduce the substrate resistance component R5 of the series resistance of the photodiode while reducing the influence of the impurity auto-doping from the P-type semiconductor substrate. Moreover, in such a case, it is not necessary to increase the impurity concentration of the substrate itself (i.e., decrease the substrate resistance) for the purpose of reducing the series resistance of the photodiode, whereby it is possible to use a substrate having a low impurity concentration. As a result, it is possible to suppress the influence of the auto-doping as well as to improve the response speed of the photodiode through a reduction in the anode resistance. Moreover, it is possible to have an even steeper concentration gradient between the P-type high-concentration impurity layer 13 and the P-type high-specific-resistance epitaxial layer 30, whereby it is possible to increase the internal electric field generated by the concentration gradient. Due to such an internal electric field, it is possible to shorten the transit time of a carrier, thereby further improving the response speed of the photodiode.

The P-type high-concentration impurity layer 13 may be formed by an epitaxial growth.

EMBODIMENT 3

FIG. 8 is a cross-sectional view illustrating a structure of a circuit-integrated light-receiving device according to Embodiment 3 of the present invention.

It is noted that elements which are provided after the metal wiring process, e.g., a multilayer line and a protection film, are not shown in FIG. 8. Moreover, elements in FIG. 8 having like reference numerals to those shown in FIG. 1 will not further be described, and only those that are different from the structure of FIG. 1 will be described below.

In addition to the elements included in the structure of Embodiment 1 as illustrated in FIG. 1, the structure of the present embodiment includes an anode electrode 26 provided on the reverse side of the substrate 1 by using a material having a small work function such as Au. The anode electrode 26 provided on the reverse side of the substrate 1 is electrically connected by any wiring method to the anode electrode 16 which is formed on the separation diffusion region 9 on side of the structure opposite to the substrate 1.

Where the anode electrode 16 is provided only on the side of the structure opposite to the substrate 1 as in the structure of Embodiment 1, if the substrate resistance is 1 Ω, the total resistance of the respective resistance components illustrated in FIG. 6A, i.e., R1 (the resistance of the separation diffusion regions), R2 (the resistance of the buried diffusion layer underlying the separation diffusion regions) and R4 (the resistance of the auto-doped layer underlying the separation diffusion regions), is about 1 kΩ. On the contrary, where the anode electrode 26 is additionally provided on the reverse side of the substrate 1 and the anode electrodes 16 and 26 are electrically connected to each other as in the present embodiment, the magnitude of the resistance component from the end of the depletion layer 5 to the anode electrode 26 is reduced to about 0.6 kΩ. As a result, it is possible to further increase the response speed of the produced photodiode.

While FIG. 8 shows a modification to the structure of Embodiment 1 (FIG. 1), it is understood that the additional anode electrode 26 of the present embodiment may alternatively be provided on the reverse side of the substrate 1 in the structure of Embodiment 2 (FIG. 7) to realize substantially the same effects as those described above.

EMBODIMENT 4

In Embodiments 1–3 as described above, the present invention has been described with respect to a structure which has one photodiode section 80. However, the present invention is not limited to such a structure, but may similarly be used with a split photodiode where the photodiode section 80 is divided into a number of portions.

A structure where a split photodiode is formed in the structure of Embodiment 1 (FIG. 1) will now be described with reference to FIG. 9. It is noted that elements which are provided after the metal wiring process, e.g., a multilayer line and a protection film, are not shown in FIG. 9. Moreover, elements in FIG. 9 having like reference numerals to those shown in FIG. 1 will not further be described.

In particular, according to the present embodiment, the photodiode section 80 further includes separation diffusion regions 71 and 91 so as to divide the photodiode section 80 into two regions 81 and 82. Each of the regions 81 and 82 acts as a photodiode, thus producing a split photodiode structure.

FIG. 10 illustrates a structure which is obtained by applying the technique of FIG. 28 disclosed in Japanese Laid-Open Publication No. 1-205564 (the formation of a deep separation diffusion region) to the split photodiode structure as illustrated in FIG. 9. For the purpose of comparison, like elements as those in the structure of the present invention are denoted by like reference numerals.

In the structure of FIG. 10, lower portions 7a and 71a of the separation diffusion regions need to be sufficiently deep so as to reach the auto-doped layer 2 of the P-type high-specific-resistance epitaxial layer 30. However, increasing the diffusion in the depth direction will also increase the amount of diffusion in the width (lateral) direction. Thus, the resulting lower portions 7a and 71a of the separation diffusion regions will be wide, as illustrated in FIG. 10.

In the split photodiode structure as illustrated in FIG. 10, each of the photodiode sections 81 and 82 has a narrow light receiving area, while the distance by which a photo carrier generated under the separation diffusion region 71 moves increases, as discussed above with reference to FIG. 29B. As a result, the response speed of the split photodiodes 81 and 82 may be reduced, and the device may not operate normally. Moreover, in order to maintain a sufficient light receiving area, it is necessary to set a sufficiently large gap between the separation diffusion region 71 or 91 formed in the photodiode section 80 and the adjacent separation diffusion region 7 or 9, respectively, thereby increasing the size of the entire device.

With the structure of the present embodiment illustrated in FIG. 9, it is possible to form a circuit-integrated light-receiving device having a split photodiode with desirable operational characteristics without causing problems such as those which may be present in the structure illustrated in FIG. 10.

While FIG. 9 shows a modification to the structure of Embodiment 1 (FIG. 1), it is understood that the present embodiment may alternatively be applied to the structure of Embodiment 2 illustrated in FIG. 7 or to the structure of Embodiment 3 illustrated in FIG. 8, thereby producing a split photodiode with substantially the same effects as those described above.

Moreover, in the above-described embodiments, a 12×-speed DVD-ROM apparatus is contemplated as an exemplary apparatus with which the circuit-integrated light-receiving device of the present invention is used. However, it is clear that the present invention is not limited to a device for use with a 12×-speed DVD-ROM apparatus.

Before describing other embodiments of the present invention, other observations that have been made by the present inventors to achieve the present invention will be described.

The structure described above with reference to FIG. 28 uses the P-type buried diffusion layer of the separation diffusion region 340 having a relatively high impurity concentration (e.g., about $1 \times 10^{18}$ atoms/cm$^3$ to about $1 \times 10^{19}$ atoms/cm$^3$). Therefore, when forming the N-type epitaxial layer 330, the impurity on the surface of the P-type buried diffusion layer of the separation diffusion region is auto-doped, thereby forming an auto-doped layer. The impurity concentration of such an auto-doped layer is typically about $10^{-3}$ of that of the auto-dope source. In the example illustrated in FIG. 28, the impurity concentration on the surface of the P-type buried diffusion layer of the separation diffusion region is about $1 \times 10^{18}$ atoms/cm$^3$ to about $1 \times 10^{19}$ atoms/cm$^3$, whereby an auto-doped layer having an impurity concentration of about $1 \times 10^{16}$ atoms/cm$^3$ is formed on the surface of the P-type epitaxial layer 320. In the P-type epitaxial layer 320, which forms the PN junction of the photodiode, the impurity concentration in the vicinity of the PN junction is preferably about $1 \times 10^{13}$ atoms/cm$^3$ to about $1 \times 10^{14}$ atoms/cm$^3$ in order to obtain a reduced junction capacitance. Therefore, when an auto-doped layer having a high impurity concentration as described above exists in the vicinity of the PN junction, the extension of the depletion layer is restricted, thereby increasing the junction capacitance and thus lowering the response speed of the photodiode.

Therefore, with the structure illustrated in FIG. 28, it is possible to reduce the series resistance of the photodiode, while the junction capacitance of the photodiode is increased by the auto-doping. Moreover, as illustrated in FIGS. 29A and 29B, the auto-doped layer formed in the vicinity of the PN junction has a significant influence on the movement of a carrier (electron) generated in the P-type substrate. Such an auto-doped layer is preferably prevented from being formed.

In view of this, the present inventors studied the width of the buried diffusion layer in order to obtain a structure in which the series resistance of the photodiode is reduced without increasing the junction capacitance of the photodiode due to auto-doping.

The impurity concentration of the auto-doped layer is typically about $10^{-3}$ of that of the auto-dope source. Therefore, in order not to increase the junction capacitance of the photodiode due to auto-doping, it is necessary to set the impurity concentration on the surface of the P-type buried diffusion layer of the separation diffusion region 340 to about $1 \times 10^{16}$ atoms/cm$^3$ or less.

FIG. 12 illustrates the results of electrical measurement of the resistance of the anode side of the photodiode for various thicknesses T of the epitaxial layer with the impurity concentration of the P-type buried diffusion layer being about $5 \times 10^{15}$ atoms/cm$^3$. The two lines in FIG. 12 respectively correspond to two different widths W of the buried diffusion layer, i.e., 4 μm and 200 μm. As can be seen from FIG. 12, the smaller the width W of the buried diffusion layer, the resistance value is larger, and the larger the thickness T of the epitaxial layer, the resistance value is larger. Normally, the width ("W1" in FIG. 18) of the buried diffusion layer 340 in the device separation section is about 4 μm or less. Therefore, it can be seen that if the buried diffusion layer is formed only in the device separation section, the series resistance of the photodiode cannot be reduced sufficiently. For example, where the thickness T of the epitaxial layer as illustrated in FIG. 11 is 20 μm, there is a difference in resistance by a factor of about 17 between the device in which the width W of the P-type buried diffusion layer 4 is 4 μm and that in which the width W of the P-type buried diffusion layer 4 is 200 μm. This is because the resistance increases when the area by which the auto-doped layer 2 formed by the upward auto-doping from the P-type semiconductor substrate 1 and the diffusion portion of the P-type buried diffusion layer 4 contact each other is small. Moreover, the increase in resistance along with an increase in the thickness of the epitaxial layer is due to a reduced impurity concentration in a contact area between the auto-doped layer 2 and the diffusion portion of the P-type buried diffusion layer 4.

Each of FIGS. 13 and 14 illustrates the results of a device simulation for the change in the resistance value with respect to the change in the width W of the P-type buried diffusion layer 4, where the thickness T of the epitaxial layer is set to 21 μm and 35 μm, respectively. In both of FIGS. 13 and 14, the resistance value decreases as the width W of the P-type buried diffusion layer 4 increases. Moreover, the resistance value tends to stop changing after the width W of the P-type buried diffusion layer 4 exceeds a certain value. Furthermore, as the thickness T of the epitaxial layer increases, the absolute resistance value increases and the width W at which the resistance value stops changing also increases.

Thus, after the width W of the P-type buried diffusion layer 4 exceeds a certain value, the resistance value stops changing because the current flow path does not widen beyond a certain width. In other words, an excessively large width W of the P-type buried diffusion layer 4 does not so much contribute to the width of the current path. Moreover, the resistance value changes less as the epitaxial layer thickness T increases, because the impurity concentration in the contact area between the auto-doped layer 2 and the buried diffusion layer 4 decreases to increase the resistance value thereof, thereby widening the current path.

The present invention has been achieved based on the above-described observations made by the present inventors. Various embodiments of the present invention will now be described with reference to the accompanying drawings.

EMBODIMENT 5

FIG. 11 is a cross-sectional view illustrating a structure of a circuit-integrated light-receiving device according to Embodiment 5 of the present invention. The circuit-integrated light-receiving device illustrated in FIG. 11 includes the photodiode section 80 and the signal processing circuit section 90 adjacent to each other. It is noted that elements which are provided after the metal wiring process, e.g., a multilayer line and a protection film, are not shown in FIG. 11.

In this structure, a P-type high-specific-resistance epitaxial layer 30 is provided on the surface of a P-type semiconductor substrate 1. The P-type high-specific-resistance epitaxial layer 30 includes the first portion 2 (also referred to as the "auto-doped layer 2") which is formed by auto-doping of an impurity from the substrate 1 and has an impurity concentration gradually decreasing in a thickness direction away from the surface of the substrate 1 and the second portion 3 (also referred to as the "uniform concentration layer 3") which is above the first portion 2 and has a uniform impurity concentration distribution in the depth direction. The structure illustrated in FIG. 11 further includes the depletion layer 5.

The N-type epitaxial layer 8 is provided on the P-type high-specific-resistance epitaxial layer 30. The separation diffusion region including the two diffusion regions 7 and 9 is provided extending through the N-type epitaxial layer 8. The separation diffusion region extends to a predetermined depth from the surface of the N-type epitaxial layer 8. The separation diffusion region divides the N-type epitaxial layer 8 into a number of regions.

Some of the separated regions of the N-type epitaxial layer 8 each form the light-receiving device section 80. In particular, the light-receiving device section 80 includes a PN junction formed between one of the separated regions of the N-type epitaxial layer 8 and the underlying P-type epitaxial layer 30. The N-type diffusion layer 22 is provided in the light-receiving device section (photodiode section) 80 in the vicinity of the surface of the N-type epitaxial layer 8 in order to reduce the cathode resistance.

The signal processing circuit section 90 is provided in a portion of the N-type epitaxial layer 8 adjacent to the photodiode section 80. In the illustrated example, the signal processing circuit section (NPN transistor) 90 includes the buried region 6 for reducing the collector resistance, the N-type compensation diffusion layer 10, the base diffusion region 11 and the emitter diffusion region 12.

The photodiode section 80 and the signal processing circuit section 90 are electrically separated from each other by the above-described separation diffusion regions 7 and 9.

The insulator layer 14 made of a material such as a silicon oxide is provided on the upper surface of the structure. The cathode electrode 15 is provided over the N-type diffusion layer 22 and is connected thereto via a contact hole. The anode electrode 16 is connected to the separation diffusion regions 7 and 9. Moreover, the predetermined electrode and line elements 17 are electrically connected to the signal processing circuit section (NPN transistor) 90 similarly via contact holes.

In the structure illustrated in FIG. 11, the thickness T of the P-type epitaxial layer 30 and the width W of the P-type buried diffusion layer 4 are set so as to satisfy the relationship W>2T for the following reasons.

As described above, in order not to increase the junction capacitance of the photodiode due to auto-doping, it is necessary to set the impurity concentration on the surface of the P-type buried diffusion layer of the separation diffusion region 4 to about $1 \times 10^{16}$ atoms/cm$^3$ or less. However, when the buried diffusion layer having such a low impurity concentration is provided only in the separation diffusion region, the resistance value increases, thereby lowering the response speed of the photodiode. As illustrated in FIGS. 13 and 14, the resistance value tends to increase as the width W of the P-type buried diffusion layer 4 decreases. Moreover, the width W of the P-type buried diffusion layer 4 at which the resistance value no longer depends on the width W of the P-type buried diffusion layer 4 tends to increase as the thickness T of the P-type high-specific-resistance epitaxial layer 30 increases. This is because as the epitaxial layer thickness T increases, the area by which the auto-doped layer 2 and the diffusion portion of the P-type buried diffusion layer 4 contact each other decreases, thereby increasing the resistance and thus increasing the width W of the P-type buried diffusion layer 4 which is required to reduce the resistance value. Thus, the width W of the P-type buried diffusion layer 4 which is required to reduce the resistance value varies according to the epitaxial layer thickness T.

In FIG. 15, the solid line shows the relationship between the epitaxial layer thickness T and the width W of the P-type buried diffusion layer 4 at which the resistance value no longer depends on the width W, and the broken line shows a W=2T line. Herein, it is assumed that the impurity concentration of the uniform concentration layer 3 of the P-type high-specific-resistance epitaxial layer 30 is about $1 \times 10^{13}$ atoms/cm$^3$, the auto-doped layer 2 is formed to have a thickness of about 15 $\mu$m from the upper surface of the substrate 1 which has an impurity concentration of $3 \times 10^{15}$ atoms/cm$^3$, the surface impurity concentration of the P-type buried diffusion layer 4 is $3 \times 10^{15}$ atms/cm$^3$, and the surface impurity concentration of the separation diffusion region 7 is about $1 \times 10^{18}$ atoms/cm$^3$.

As is apparent from FIG. 15, by satisfying the relationship of W>2T, it is possible to sufficiently reduce the resistance in the contact area between the auto-doped layer 2 and the buried diffusion layer 4, thereby reducing the series resistance of the photodiode and thus improving the response speed thereof. Where W>2T, while the resistance value does not depend on the width W of the P-type buried diffusion layer 4, the resistance value varies as the thickness T varies. The preferable resistance value can be determined by the capacitance value of the photodiode and the intended response speed of the photodiode. When the intended response speed of the photodiode is 120 MHz and the light receiving area of the photodiode is 60 $\mu$m×120 $\mu$m, the capacitance value of the photodiode is 0.6 pF. Therefore, the series resistance of the photodiode is preferably 2.2 k$\Omega$ or less. The preferable epitaxial layer thickness T for obtaining such a resistance value can be calculated to be 27 $\mu$m or less by an interpolation based on FIG. 13 (900 $\Omega$ at T=21 $\mu$m) and FIG. 14 (4000 $\Omega$ at T=35 $\mu$m). Then, the width W of the P-type buried diffusion layer 4 can be determined so as to satisfy the relationship W>2T for the calculated value of the thickness T.

Next, a method for producing a light-receiving device according to the present embodiment having such a structure will be described with reference to FIGS. 16A to 16F.

Figure 16A:
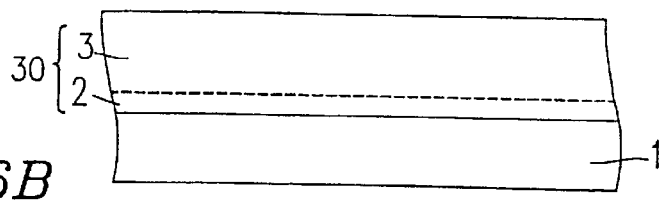

First, referring to FIG. 16A, the P-type high-specific-resistance epitaxial layer 30 is formed on the P-type semiconductor substrate 1. At this point, the auto-doped layer 2 having a certain thickness is already formed in a lower portion of the P-type high-specific-resistance epitaxial layer 30. The impurity concentration of the auto-doped layer 2 gradually decreases in the direction away from the upper surface of the substrate 1. The rest of the P-type highspecific-resistance epitaxial layer 30 is the uniform concentration layer 3 having a constant impurity concentration.

Figure 16B:
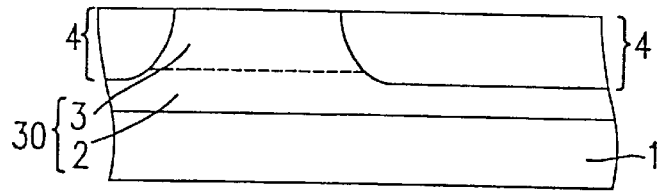

Then, referring to FIG. 16B, the P-type buried diffusion layer 4 is formed in a predetermined region of the P-type high-specific-resistance epitaxial layer 30 (mainly where the signal processing circuit will later be formed). The width W of the P-type buried diffusion layer 4 is set to satisfy the relationship W>2T for the thickness T of the P-type high-specific-resistance epitaxial layer 30.

Figure 16C:
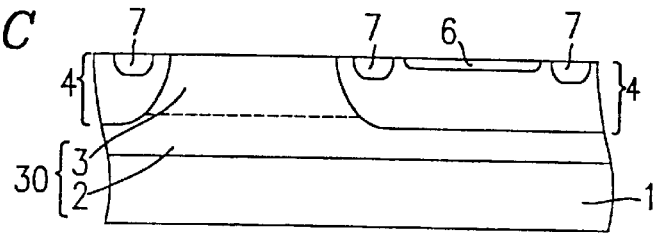

Then, referring to FIG. 16C, the separation diffusion region (buried separation diffusion layer) 7 and the buried region 6 are formed near the upper surface of the P-type buried diffusion layer 4.

Figure 16D:
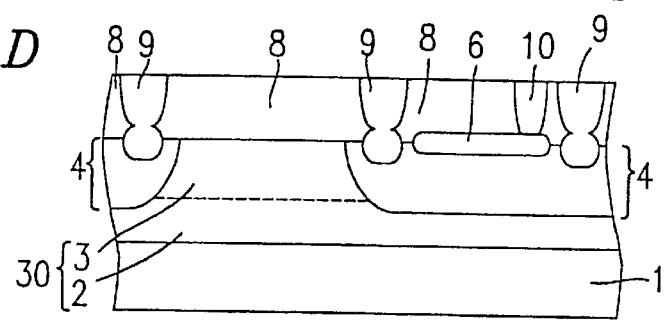

Then, referring to FIG. 16D, the N-type epitaxial layer 8 is formed on the P-type buried diffusion layer 4 and the P-type high-specific-resistance epitaxiallayer 30. The separation diffusion region 9 is formed to downwardly extend from the upper surface of the N-type epitaxial layer 8 to join the separation diffusion region 7. The N-type compensation diffusion layer 10 is further formed in the N-type epitaxial layer 8 in the signal processing circuit section.

Figure 16E:
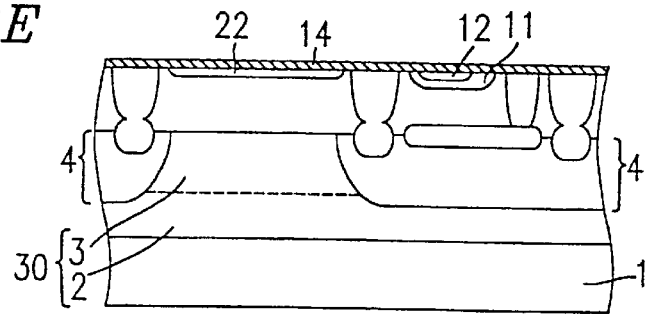

Then, referring to FIG. 16E, a P-type impurity is diffused into the surface portion of the N-type epitaxiallayer 8 in the signal processing circuit section so as not to overlap the N-type compensation diffusion layer 10, thereby forming the base diffusion region 11. Then, an N-type impurity is diffused into the base diffusion region 11 to form the emitter diffusion region 12. Simultaneously with the formation of the emitter diffusion region 12, the N-type diffusion layer 22 for reducing the series resistance on the cathode side of the light-receiving device (photodiode) to be produced is formed in the surface portion of the N-type epitaxial layer 8 in the light-receiving device section. Moreover, the insulator layer 14 of oxide silicon, or the like, is formed to cover the upper surface of the N-type epitaxial layer 8 having the regions various formed therein.

Figure 16F:
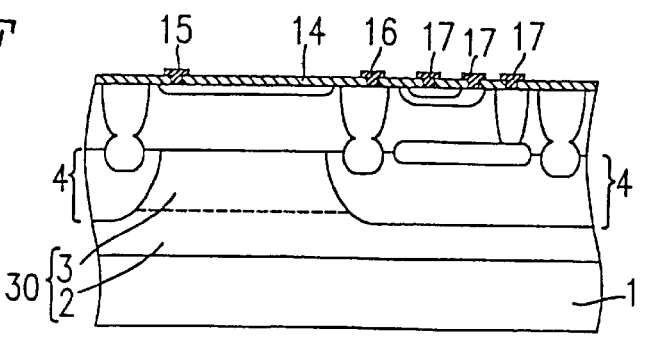

Then, referring to FIG. 16F, contact holes are provided in predetermined locations of the insulator layer 14. Then, the cathode electrode 15 and the anode electrode 16 of aluminum, or the like, are formed to be connected to the N-type diffusion layer 22 of the light-receiving device (photodiode) and to the separation diffusion region 9, respectively. For the signal processing circuit section, the electrode and line elements 17 of aluminum, or the like, are formed to be connected to the respective diffusion regions of the produced device (NPN transistor).

Thereafter, other processes commonly employed in the art of semiconductor technology, including a multilayer line formation step and a protection film formation step (these steps will not further be described herein), are performed, thereby producing a circuit-integrated light-receiving device in which a signal processing circuit (NPN transistor) and a photodiode are integrally formed adjacent to each other.

Next, referring to FIGS. 17A and 17B, the series resistance of the photodiode of the present embodiment will be described.

FIG. 17A shows the structure. of the light-receiving device of the present embodiment of FIG. 11 with the respective resistance components of the series resistance of the photodiode (as described in the prior art section) being superimposed thereon. As can be seen from FIG. 17A, in the structure of the present embodiment, the series resistance of the photodiode includes the following components R1–R6:

R1: The resistance of the separation diffusion regions 7 and 9

R2: The resistance of the buried diffusion layer 4

R4: The resistance of the auto-doped layer 2 underlying the separation diffusion regions R5: The resistance of the substrate 1

R6: The resistance of the auto-doped layer 2 underlying the photodiode section 80

Because the buried diffusion layer 4 is in contact with the auto-doped layer 2 and the depletion layer 5 in the photodiode section 80 is contact with the auto-doped layer 2, the resistance components R3 and R7 as described in the prior art section no longer exist in the structure of the present invention.

Moreover, because the separation diffusion regions 7 and 9 have a high impurity concentration, the resistance R1 thereof is low. Normally, the impurity concentration of the separation diffusion is in a range of about $1 \times 10^{17}$ atoms/cm$^3$ to about $1 \times 10^{18}$ atoms/cm$^3$, which is negligible for the series resistance component of the photodiode. With such an impurity concentration, the separation diffusion region 7 is formed with a width (normally about 4 μm) which is less than that of the P-type buried diffusion layer 4 of the separation diffusion region. Therefore, it is believed that the influence on auto-doping is insubstantial. Moreover, each of the substrate resistance R5 and the resistance components R2, R4 and R6 created due to the auto-doped layer 2 and the buried diffusion layer 4 can be reduced to a value (e.g. about 200 Ω or less) which does not substantially contribute to the series resistance of the photodiode. In order not to increase the junction capacitance of the photodiode due to auto-doping, it is preferred to set the impurity concentration on the surface of the P-type buried diffusion layer of the separation diffusion region to about $1 \times 10^{16}$ atoms/cm$^3$ or less.

Furthermore, in the present embodiment, the width W of the P-type buried diffusion layer 4 is set to satisfy the relationship W>2T for the thickness T of the epitaxial layer 30. Therefore, even if the resistance in the contact area between the auto-doped layer 2 and the buried diffusion layer 4 is reduced, it is possible to reduce the series resistance of the photodiode and improve the response speed thereof. Moreover, unlike the conventional example illustrated in FIG. 28, it is not necessary to set the impurity concentration on the surface of the buried diffusion layer 4 of the separation diffusion region to a high value such that auto-doping occurs in the vicinity of the PN junction. Thus, it is possible to avoid the various problems present in the prior art such as an increase in the junction capacitance of the photodiode, and to obtain a photodiode with a small junction capacitance and a high response speed.

FIG. 17B illustrates a comparative structure where the structure of Embodiment 5 of the present invention as illustrated in FIG. 11 is modified according to a typical conventional structure (where the auto-doped layer 2 of the P-type high-specific-resistance epitaxial layer 30 is not in contact with the depletion layer 5 or the burled diffusion layer 4), with the respective resistance components R1–R7 of the series resistance of the photodiode being superimposed thereon. For the purpose of comparison, like elements as those in the structure of the present embodiment are denoted by like reference numerals. As can be seen, even when the buried diffusion layer 4 is not in contact with the auto-doped layer 2, the series resistance of the photodiode can be reduced by setting the thickness T of the epitaxial layer 30 and the width W of the buried diffusion layer 4 so as to satisfy the relationship W>2T. This similarly applies to any of the subsequent embodiments of the present invention.

Moreover, it is also possible in the present embodiment to provide the impurity layer 13 between the substrate 1 and the P-type epitaxial layer 30, as illustrated in FIG. 7, so as to further improve the response speed of the photodiode. Furthermore, it is also possible in the present embodiment to provide the anode electrode 26 on the reverse side of the substrate 1 and electrically connect the anode electrode 26 to another anode electrode provided on the side of the structure opposite to the substrate in the separation diffusion region, as illustrated in FIG. 8, so as to further reduce the respective resistance components of the photodiode. This similarly applies to any of the subsequent embodiments of the present invention.

EMBODIMENT 6

FIG. 18 is a cross-sectional view illustrating a structure of a circuit-integrated light-receiving device according to Embodiment 6 of the present invention. It is noted that elements which are provided after the metal wiring process, e.g., a multilayer line and a protection film, are not shown in FIG. 18. Moreover, elements in FIG. 18 having like reference numerals to those illustrated in Embodiment 5 (FIG. 11) will not further be described, and only those that are different from the structure of Embodiment 5 will be described below.

The cross-sectional structure of the circuit-integrated light-receiving device of Embodiment 6 is substantially the same as that of Embodiment 5 illustrated in FIG. 11. The distinct feature of Embodiment 6 is in that the length L of the P-type buried diffusion layer 4 is larger than that of the photodiode (light-receiving device section).

As already discussed in Embodiment 5 above, in order to reduce the series resistance of the photodiode, it is necessary to increase the cross-sectional area by which the auto-doped layer 2 and the P-type buried diffusion layer 4 contact each other. In view of this, the present inventors have studied the relationship between the length of the P-type buried diffusion layer 4 and that of the photodiode.

FIG. 19 illustrates the results of measurement of the response speed (cut-off frequency) of the photodiode for various lengths of the P-type buried diffusion layer 4 with the length of the photodiode being set to 277 μm. As is apparent from FIG. 19, when the length of the P-type buried diffusion layer 4 is less than that of the photodiode, the response speed is reduced, whereas when the length of the P-type buried diffusion layer 4 is equal to or greater than that of the photodiode, the response speed does not substantially change from a certain level. This is because the series resistance on the anode side of the photodiode increases, thereby increasing the CR component, when the length of the P-type buried diffusion layer 4 is less than that of the photodiode.

Therefore, when the length L of the P-type buried diffusion layer 4 is set to be larger than that of the photodiode, as in the present embodiment, it is possible to increase the response speed of the photodiode.

EMBODIMENT 7

FIG. 20 is a cross-sectional view illustrating a structure of a circuit-integrated light-receiving device according to Embodiment 7 of the present invention. It is noted that elements which are provided after the metal wiring process, e.g., a multilayer line and a protection film, are not shown in FIG. 20. Moreover, elements in FIG. 20 having like reference numerals to those illustrated in Embodiment 5 (FIG. 11) will not further be described, and only those that are different from the structure of Embodiment 5 will be described below.

The structure of the present embodiment is different from that of the structure of Embodiment 5 illustrated in FIG. 11 in that the P-type buried diffusion layer 4 in a predetermined location in the P-type high-specific-resistance epitaxial layer 30 is provided so as not to extend beyond the P-type separation diffusion region (buried separation diffusion layer) 7 for the anode electrode 16 toward the light-receiving device section 80.

FIG. 21 illustrates a portion of the structure of FIG. 20 that is encircled by a solid line. When the P-type buried diffusion layer 4 extends beyond the P-type buried separation diffusion layer 7 toward the light-receiving device section 80, as illustrated in FIG. 21, the extension portion may be irradiated with light. Since the portion of the substrate corresponding to the extension portion is not depleted, the photo carrier moves by diffusion, thereby causing problems such as a reduction in the response speed. Moreover, when the P-type buried diffusion layer 4 extends beyond the P-type buried separation diffusion layer 7, the junction capacitance between the N-type epitaxial layer 8 and the P-type buried diffusion layer 4 increases, thereby lowering the response speed of the photodiode. Furthermore, possible variation in the location of the P-type buried diffusion layer 4 with respect to the P-type buried separation diffusion layer 7, may lead to variation in the junction capacitance of the photodiode and/or the response speed thereof.

When the P-type buried diffusion layer 4 is provided so as not to extend beyond the P-type buried separation diffusion layer 7 toward the light-receiving device section 80 as in the present embodiment, it is possible to realize a photodiode having a high response speed without the above-described problems.

EMBODIMENT 8

FIG. 22 is a cross-sectional view illustrating a circuit-integrated light-receiving device according to Embodiment 8 of the present invention. It is noted that elements which are provided after the metal wiring process, e.g., a multilayer line and a protection film, are not shown in FIG. 22. Moreover, elements in FIG. 22 having like reference numerals to those illustrated in Embodiment 7 (FIG. 20) will not further be described, and only those that are different from the structure of Embodiment 7 will be described below.

The structure of the present embodiment is different from that of the structure of Embodiment 7 illustrated in FIG. 20 in that one or more anode-electrode-extraction P-type buried separation diffusion region 7a is provided in addition to the P-type buried separation diffusion layer 7 provided in the extension diffusion portion at the end of the P-type buried diffusion layer 4.

FIG. 23 illustrates three structures (a)–(c) including the P-type buried separation diffusion layer 7 on the P-type buried diffusion layer 4 and optionally the P-type buried separation diffusion regions 7a, with response speeds for the respective structures (a)–(c). In the structure (a), where the P-type buried separation diffusion layer 7 is provided only in the extension diffusion portion of the P-type buried diffusion layer 4, the contact between the extension diffusion portion of the P-type buried diffusion layer 4 and the auto-doped layer 2 of the P-type semiconductor substrate 1 is insufficient, thereby increasing the resistance. Thus the series resistance of the photodiode is increased, thereby lowering the response speed thereof. On the contrary, in the structures (b) and (a), the P-type buried diffusion layer 4 and the auto-doped layer 2 of the P-type semiconductor substrate 1 uniformly contact each other in portions of the structure other than the extension diffusion portion of the P-type buried diffusion layer 4. Therefore, if the P-type buried separation diffusion regions 7a are provided in such portions of the structure, the response speed of the photodiode is improved.

Thus, the P-type buried separation diffusion regions 7a are provided in addition to the P-type buried separation diffusion layer 7 provided in the extension diffusion portion of the P-type buried diffusion layer 4, as in the present embodiment, it is possible to prevent the response speed of the photodiode from lowering, thereby realizing a photodiode with a high response speed. Moreover, by providing the P-type buried separation diffusion region 7a in the vicinity of the photodiode, it is possible to reduce the resistance component in the glateral direction (width direction) of the P-type buried diffusion layer 4 and thus to reduce the series resistance of the photodiode. Thus, it is preferred to provide the P-type buried separation diffusion region 7a in the vicinity of the photodiode.

Each of FIGS. 24A and 24B illustrates the results of a device simulation for the current flow for a case where the P-type buried separation diffusion layer is provided in a portion of the structure other than the extension diffusion portion of the P-type buried diffusion layer 4. FIG. 24A illustrates the current flow, and FIG. 24B illustrates a current distribution. FIG. 24B shows a current value per 1 $cm^2$ for a distance of 1 $\mu m$ in the direction normal to the figure sheet (total current value T–j $A/cm^2$), with a location of a larger current value being denoted by a higher dot density.

As is apparent from FIG. 24B, most of the current flowing through the substrate 1 flows into the P-type buried separation diffusion region 7a provided in a portion of the buried diffusion layer 4 which is uniformly contacted by the auto-doped layer 2 of the P-type semiconductor substrate 1. While about 30% of the current flows into the P-type buried separation diffusion region 7 provided in the extension diffusion portion of the P-type buried diffusion layer 4, about 70% of the current flows into the P-type buried separation diffusion region 7a provided in the portion of the P-type buried diffusion layer 4 which is uniformly contacted by the auto-doped layer 2 of the P-type semiconductor substrate 1. This is because in the extension diffusion portion of the P-type buried diffusion layer 4, the contact between the P-type buried diffusion layer 4 and the auto-doped layer 2 is insufficient and thus the resistance is high, whereby the current more easily flows into the P-type buried separation diffusion region 7a provided in the portion of the P-type buried diffusion layer 4 which uniformly contacts the auto-doped layer 2.

Even when the P-type buried separation diffusion region 7 is provided only in the extension diffusion portion of the P-type buried diffusion layer 4, it is possible to reduce the resistance component by increasing the width of the P-type buried separation diffusion region 7. In such a case, however, the P-type buried separation diffusion region 7 will have a larger exposed area and thus a larger amount of an impurity. Moreover, the P-type buried separation diffusion region 7 is in the vicinity of the photodiode. Therefore, the junction capacitance of the photodiode increases due to auto-doping from the surface of the P-type buried separation diffusion region 7, thereby reducing the response speed. Thus, it is preferred to provide one or more P-type buried separation diffusion region 7a in the region where the auto-doped layer 2 of the P-type semiconductor substrate l and the P-type buried diffusion layer 4 uniformly contact each other so as to reduce the resistance component of the photodiode. Nevertheless, the width of the P-type buried separation diffusion region 7 is preferably increased to a degree such that auto-doping from the surface of the P-type buried separation diffusion region 7 does not increase the junction capacitance of the photodiode.

EMBODIMENT 9

FIG. 25 is a cross-sectional view illustrating a circuit-integrated light-receiving device according to Embodiment 9 of the present invention. It is noted that elements which are provided after the metal wiring process, e.g., a multilayer line and a protection film, are not shown in FIG. 25. Moreover, elements in FIG. 25 having like reference numerals to those illustrated in Embodiment 5 (FIG. 11) will not further be described, and only those that are different from the structure of Embodiment 5 will be described below.

The structure of the present embodiment is different from that of the structure of Embodiment 5 illustrated in FIG. 11 in that the light-receiving device section is divided into a number of regions each of which acts as a photodiode, thereby providing a split photodiode, and in that the P-type buried diffusion layer 4 is provided across the entire area of a portion of the structure in the vicinity of the photodiode which requires a high response speed which is not irradiated with light.

Conventionally, a light-receiving device for use in an optical pick-up, or the like, employs a split photodiode so as to obtain a number of optical signals from light reflected by the disk and to perform a tracking operation, a focusing operation and to read an RF signal, or the like, based on the difference and the sum of the optical signals. In such a case, each of the light-receiving device sections is irradiated with light. However, a high response speed characteristic is not necessary for all of the photodiode portions, but it is required only for the photodiode portion used to read an RF signal. Therefore, in the photodiode portion which requires a high response speed characteristic, the width W of the P-type buried diffusion layer 4 is preferably set to satisfy the relationship W>2T with respect to the epitaxial layer thickness T, as described in Embodiment 5.

However, since the light beam irradiation interval is determined by the optical design limitations of the optical pick-up, as illustrated in FIG. 25, it may not be possible to ensure a sufficient width of the separation diffusion region. In such a case, the P-type buried diffusion layer 4 may be provided across the entire area of a portion of the structure in the vicinity of the photodiode which requires a high response speed which is not irradiated with light, thereby realizing a high response speed operation of the photodiode.

While it is assumed in Embodiments 1–9 above that the "first conductivity type" is a P type, and the "second conductivity type" is an N type, the first and second conductivity types may alternatively be an N type and a P-type, respectively.

As described above, the present invention provides a circuit-integrated light-receiving device in which a signal processing circuit section is provided adjacent to a photodiode section which is provided by using a PN junction between an N-type epitaxial layer and a P-type epitaxial layer. A buried diffusion layer is provided to extend from the surface of the N-type epitaxial layer of the signal processing circuit section into the P-type epitaxial layer so as to contact an auto-doped layer of the P-type epitaxial layer. As a result, a P-type high-specific-resistance layer does not exist between the buried diffusion layer and the auto-doped layer. Thus, it is possible to reduce the series resistance of the produced photodiode.

A device which satisfies the desired specification can be obtained by setting the impurity concentration value at the location where the buried diffusion layer and the auto-doped layer contact each other to be equal to or greater than a concentration value which is calculated from the response speed characteristic value (e.g., a cut-off frequency) required for the photodiode.

Moreover, the formation of the auto-doped layer in the vicinity of the PN junction can be suppressed by setting the impurity concentration of the substrate to a level such that the influence of the impurity auto-doping from the substrate to the P-type epitaxial layer is negligible. In this way, the restriction of the extension of the depletion layer formed in the photodiode section and the formation of the potential barrier for an electron at the PN junction, which present a problem when an auto-doped layer exists in the vicinity of the PN junction, can be suppressed, thereby preventing the response speed of the photodiode from lowering.

Moreover, when a P-type high-impurity concentration layer is provided between the substrate and the P-type epitaxial layer by introducing a high concentration of P-type impurity such as boron, it is possible to suppress the influence of auto-doping from the P-type semiconductor substrate and to reduce the substrate resistance component R5 of the series resistance of the photodiode, thereby improving the response speed of the photodiode through a reduction in the anode resistance. Moreover, it is possible to have an even steeper concentration gradient between the P-type high-concentration impurity layer 13 and the P-type high-specific-resistance epitaxial layer 30, whereby it is possible to increase the internal electric field generated by the concentration gradient. Due to such an internal electric field, it is possible to shorten the transit time of a carrier, thereby further improving the response speed of the photodiode. Moreover, in such a case, it is not necessary to increase the impurity concentration of the substrate itself (i.e., decrease the substrate resistance) for the purpose of reducing the series resistance of the photodiode, whereby it is possible to use a substrate having a low impurity concentration.

The junction capacitance of the photodiode section can be improved by setting the thickness and the specific resistance of the P-type high-specific-resistance epitaxial layer so that the depletion layer formed in the photodiode section contacts the auto-doped layer. Moreover, if an electrode (e.g., an anode electrode) is provided also on the reverse side of the substrate and is connected to a terminal (e.g., an anode terminal) which is formed in the light-receiving device section on the side of the structure opposite to the substrate, it is possible to reduce the resistance components shown in FIG. 11A such as R1 (the resistance of the separation diffusion region), R2 (the resistance of the buried diffusion layer underlying the separation diffusion region) and R4 (the resistance of the autodoped layer underlying the separation diffusion region), as compared to the case where an electrode is provided only on the side of the structure opposite to the substrate.

The present invention further provides a circuit-integrated light-receiving device in which the junction capacitance and the series resistance of the photodiode are both reduced, and which includes a photodiode section with a sufficiently high response speed for use with, for example, a 12x-speed DVD-ROM apparatus.

The present invention also provides a circuit-integrated light-receiving device in which a signal processing circuit section is provided adjacent to a photodiode section which is provided by using a PN junction between an N-type epitaxial layer and a P-type epitaxial layer, wherein the width W of the buried diffusion layer, which is provided to extend from the surface of the second conductivity type epitaxial layer of the signal processing circuit into the first conductivity type epitaxial layer, is set to satisfy the relationship:

$$W > 2T$$

with respect to the thickness T of the first conductivity type epitaxial layer. In this way, it is possible to obtain a photodiode capable of operating at a high speed in which the series resistance of the photodiode can be reduced sufficiently without problems such as an increase in the photodiode junction capacitance due to auto-doping.

Moreover, by setting the length of the buried diffusion layer, which is provided to extend from the surface of the second conductivity type epitaxial layer into the first conductivity type epitaxial layer, to be equal to or greater than the length of the light-receiving device section (photodiode), it is possible to reduce the series resistance of the photodiode on the substrate side, thereby improving the response speed of the photodiode.

Moreover, when the buried diffusion layer, which is provided to extend from the surface of the second conductivity type epitaxial layer into the first conductivity type epitaxial layer, does not extend beyond the overlying burled separation diffusion layer toward the light-receiving device section, it is possible to prevent the photodiode capacitance from increasing, and thus to improve the response speed of the photodiode.

In such a case, when one or more buried separation diffusion layers is additionally provided in a portion of the structure other than the extension diffusion portion of the buried diffusion layer, it is possible to reduce the series resistance of the photodiode on the substrate side, and thus to improve the response speed of the photodiode.

In the case of a split photodiode, the light beam irradiation interval is determined by the optical design limitations of the optical pick-up. Therefore, it may not be possible to ensure a sufficient width of each photodiode portion so as to satisfy the relationship W>2T. In such a case, a buried diffusion layer may be provided across the entire area of a portion of the structure in the vicinity of the photodiode which requires a high response speed which is not irradiated with light, thereby realizing a high response speed operation of the photodiode.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A circuit-integrated light-receiving device, comprising:
   a semiconductor substrate of a first conductivity type;
   a first semiconductor crystal growth layer of the first conductivity type provided on a surface of the semiconductor substrate, wherein the first semiconductor crystal growth layer includes a first portion whose impurity concentration gradually decreases in a direction away from the surface of the semiconductor substrate, and a second portion located in a first region above the first portion whose impurity concentration distribution is uniform in a depth direction;
   a buried diffusion layer of the first conductivity type located in a second region which is above the first portion of the first semiconductor crystal growth layer, and which does not overlap the first region;
   a second semiconductor crystal growth layer of a second conductivity type which is provided across a surface of the first semiconductor crystal growth layer and a surface of the buried diffusion layer; and
   a separation diffusion region of the first conductivity type that contacts the second portion but not the first portion of the first semiconductor crystal growth layer, for dividing the second semiconductor crystal growth layer into a light-receiving device section and a signal processing circuit section, wherein:
the first region is located in the light-receiving device section; and
in the signal processing circuit section, the buried diffusion layer is in contact with the first portion of the first semiconductor crystal growth layer.

2. A circuit-integrated light-receiving device according to claim 1, wherein:
the first conductivity type is a P type; and
an impurity concentration of the semiconductor substrate is about $1\times10^{16}$ atoms/cm$^3$ or less.

3. A circuit-integrated light-receiving device according to claim 1, wherein:
the first conductivity type is a P type; and
an impurity concentration at an interface between the buried diffusion layer and the first portion of the first semiconductor crystal growth layer is about $1\times10^{13}$ atoms/cm$^3$ or more.

4. A circuit-integrated light-receiving device according to claim 1, wherein:
the first conductivity type is a P type; and
a surface impurity concentration of the buried diffusion layer in the separation diffusion region is about $1\times10^{16}$ atoms/cm$^3$ or less.

5. A circuit-integrated light-receiving device according to claim 1, further comprising an impurity layer of a first conductivity type between the semiconductor substrate and the first semiconductor crystal growth layer.

6. A circuit-integrated light-receiving device according to claim 5, wherein:
the first conductivity type is a P type; and
an impurity concentration of the impurity layer is in a range of about $1\times10^{16}$ atoms/cm$^3$ to about $1\times10^{19}$ atoms/cm$^3$.

7. A circuit-integrated light-receiving device according to claim 1, wherein an impurity concentration and a thickness of the first semiconductor crystal growth layer are adjusted so that a depletion layer extends through the first semiconductor crystal growth layer to reach the first portion of the first semiconductor crystal growth layer when a bias voltage is applied across the light-receiving device including the second semiconductor crystal growth layer and the first semiconductor crystal growth layer.

8. A circuit-integrated light-receiving device according to claim 1, further comprising an electrode on a reverse side of the semiconductor substrate, wherein the electrode is connected to a terminal of a light-receiving device provided in the light-receiving device section.

9. A circuit-integrated light-receiving device according to claim 1, wherein the first portion of the first semiconductor crystal growth layer is an auto-doped layer which is formed by an auto-doping of an impurity from the semiconductor substrate.

10. A circuit-integrated light-receiving device according to claim 1. wherein the light-receiving device section is divided into a number of regions, thereby providing a split photodiode including the same number of photodiode portions.

11. A circuit-integrated light-receiving device according to claim 1, wherein a length of the buried diffusion layer is set to be equal to or greater than that of the light-receiving device section.

12. A circuit-integrated light-receiving device according to claim 1, wherein the buried diffusion layer is provided so as not to extend beyond an overlying buried separation diffusion layer toward the light-receiving device section.

13. A circuit-integrated light-receiving device according to claim 1, wherein one or more buried separation diffusion layer is provided in an upper portion of the buried diffusion layer in addition to another buried separation diffusion layer which is provided in an extension diffusion portion at an end thereof.

14. A circuit-integrated light-receiving device according to claim 10, wherein the buried diffusion layer is provided across an entire area of a portion of the circuit-integrated light-receiving device which is in a vicinity of one of the photodiode portions requiring a high response speed and which is not irradiated with light.

15. A circuit-integrated light-receiving device, comprising:
a semiconductor substrate of a first conductivity type;
a first semiconductor crystal growth layer of the first conductivity type provided on a surface of the semiconductor substrate, wherein the first semiconductor crystal growth layer includes a first portion whose impurity concentration gradually decreases in a direction away from the surface of the semiconductor substrate, and a second portion located in a first region above the first portion whose impurity concentration distribution is uniform in a depth direction;
a buried diffusion layer of the first conductivity type located in a second region which is above the first portion of the first semiconductor crystal growth layer, and which does not overlap the first region;
a second semiconductor crystal growth layer of a second conductivity type which is provided across a surface of the first semiconductor crystal growth layer and a surface of the buried diffusion layer; and
a separation diffusion region of the first conductivity type that contacts the second portion but not the first portion of the first semiconductor crystal growth layer, for dividing the second semiconductor crystal growth layer into a light-receiving device section and a signal processing circuit section, wherein:
the first region is located in the light-receiving device section; and
a width W of the buried diffusion layer and a thickness T of the first semiconductor crystal growth layer are set to satisfy a relationship:
W>2T.

16. A circuit-integrated light-receiving device according to claim 15, wherein:
the first conductivity type is a P type; and
an impurity concentration of the semiconductor substrate is about $1\times10^{16}$ atoms/cm$^3$ or less.

17. A circuit-integrated light-receiving device according to claim 15, wherein:
the first conductivity type is a P type; and
an impurity concentration at an interface between the buried diffusion layer and the first portion of the first semiconductor crystal growth layer is about $1\times10^{13}$ atoms/cm$^3$ or more.

18. A circuit-integrated light-receiving device according to claim 15, wherein:
the first conductivity type is a P type; and
a surface impurity concentration of the buried diffusion layer in the separation diffusion region is about $1\times10^{16}$ atoms/cm$^3$ or less.

19. A circuit-integrated light-receiving device according to claim 15, further comprising an impurity layer of a first conductivity type between the semiconductor substrate and the first semiconductor crystal growth layer.

20. A circuit-integrated light-receiving device according to claim 19, wherein:

the first conductivity type is a P type; and an impurity concentration of the impurity layer is in a range of about $1\times10^{16}$ atoms/cm$^3$ to about $1\times10^{19}$ atoms/cm$^3$.

21. A circuit-integrated light-receiving device according to claim 15, wherein an impurity concentration and a thickness of the first semiconductor crystal growth layer are adjusted so that a depletion layer extends through the first semiconductor crystal growth layer to reach the first portion of the first semiconductor crystal growth layer when a bias voltage is applied across the light-receiving device including the second semiconductor crystal growth layer and the first semiconductor crystal growth layer.

22. A circuit-integrated light-receiving device according to claim 15, further comprising an electrode on a reverse side of the semiconductor substrate, wherein the electrode is connected to a terminal of a light-receiving device provided in the light-receiving device section.

23. A circuit-integrated light-receiving device according to claim 15, wherein the first portion of the first semiconductor crystal growth layer is an auto-doped layer which is formed by an auto-doping of an impurity from the semiconductor substrate.

24. A circuit-integrated light-receiving device according to claim 15, wherein the light-receiving device section is divided into a number of regions, thereby providing a split photodiode including the same number of photodiode portions.

25. A circuit-integrated light-receiving device according to claim 15, wherein a length of the buried diffusion layer is set to be equal to or greater than that of the light-receiving device section.

26. A circuit-integrated light-receiving device according to claim 15, wherein the buried diffusion layer is provided so as not to extend beyond an overlying buried separation diffusion layer toward the light-receiving device section.

27. A circuit-integrated light-receiving device according to claim 15, wherein one or more buried separation diffusion layer is provided in an upper portion of the buried diffusion layer in addition to another buried separation diffusion layer which is provided in an extension diffusion portion at an end thereof.

28. A circuit-integrated light-receiving device according to claim 24, wherein the buried diffusion layer is provided across an entire area of a portion of the circuit-integrated light-receiving device which is in a vicinity of one of the photodiode portions requiring a high response speed and which is not irradiated with light.

* * * * *